United States Patent
Takahashi

(10) Patent No.: US 6,930,945 B2
(45) Date of Patent: Aug. 16, 2005

(54) SEMICONDUCTOR MEMORY DEVICE AND CONTROL METHOD THEREOF

(75) Inventor: Hiroyuki Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/692,383

(22) Filed: Oct. 23, 2003

(65) Prior Publication Data

US 2004/0079968 A1 Apr. 29, 2004

(30) Foreign Application Priority Data

Oct. 29, 2002 (JP) .................................... 2002-314327

(51) Int. Cl.[7] ............................................... G11C 7/00
(52) U.S. Cl. ................................... 365/222; 365/233
(58) Field of Search ............................. 365/222, 233, 365/189.01

(56) References Cited

U.S. PATENT DOCUMENTS

| | | | | |
|---|---|---|---|---|
| 6,166,980 A | * | 12/2000 | Chun .......................... | 365/222 |
| 6,636,449 B2 | * | 10/2003 | Matsuzaki ................... | 365/222 |
| 6,744,684 B2 | * | 6/2004 | Arimoto et al. ............ | 365/222 |

FOREIGN PATENT DOCUMENTS

| JP | A-3-263685 | 11/1991 |
|---|---|---|
| JP | 2653689 | 5/1997 |
| JP | P2001-283587 A | 10/2001 |

OTHER PUBLICATIONS

Nihon Cypress K.K., CYPRESS News Release, "NPF–LA–1 Interface Specification Compatible with QDR SRAM" (2 pages); http://www.cypress–japan.co.jp/cynews020715.html.

Enhanced Memory Systems, Inc., Web Page Products News; Preliminary Datasheet, 72Mbit Pipelined BSRAM w/ NoBL Architecture 2M×36 (30 pages) http://www.edram.com/products/datasheets/ss2625ds_rl.1.pdf (p. 6).

* cited by examiner

*Primary Examiner*—Anh Phung
(74) *Attorney, Agent, or Firm*—Choate, Hall & Stewart LLP

(57) ABSTRACT

A semiconductor memory device, which can hides a delay in a refresh operation from an outside for speeding up operation, comprises a memory cell including first and second transistors connected between a bit line for a write system and a bit line for a read system, and a capacitor C for data storage, in which a word line for a write system and a word line for a read system are connected to control terminals of the two transistors, respectively, a circuit for comparing a refresh address with an address selected according to a read/write signal among read/write addresses from an address holding circuit for holding input address signal and performing control so that if a mismatch is detected, a read/write operation using one of the read and write systems, selected by the read or write address and a refresh operation using the other of the read and write systems, selected by the refresh address are performed in parallel and if a match has been detected, the read or write operation using the word line and the bit line associated with one of the read and write systems is performed.

30 Claims, 13 Drawing Sheets

SEMICONDUCTOR MEMORY DEVICE AND CONTROL METHOD THEREOF

FIELD OF THE INVENTION

The present invention relates to a semiconductor memory device. More specifically, the invention relates to a dynamic semiconductor memory device suitable for being applied to a semiconductor memory device compliant with an SRAM (static random access memory), and its control method.

BACKGROUND OF THE INVENTION

A QDR (Quad Data Rate) SRAM device comprises two ports that operate independently at twice a rate of a conventional synchronous type memory and can transfer four data items per clock cycle (refer to reference 1 (non-patent document)). A data port of a QDR II, which is a QDR SRAM family product, is divided into an input port and an output fort and functions at a DDR (double data rate).

Reference 1 (Non-Patent Document 1):

Nihon Cypress K.K., CYPRESS News Release, "NPF-LA-1 Interface Specification Compatible with QDR SRAM" [Searched on Oct. 3, 2002] Via Internet <URL:http://www.cypress-japan.co.jp/cynews020715.html>

As is well known, since a DRAM (dynamic random access memory) device requires a refresh operation and a pre-charge operation for a bit line, an SRAM device is excellent in terms of a data access cycle. On the other hand, in an SRAM device, each cell is constituted from four or six transistors. A high resistive load type cell is constituted from four transistors, i.e., two selection transistors connected to a pair of bit lines and two transistors with their gates and drains cross-connected to each other. A CMOS type cell is constituted from the six transistors. In a DRAM device, a cell is constituted from one transistor and one capacitor. It means that a DRAM is superior to an SRAM in an area, power dissipation, and a cost. Thus, there is proposed an enhanced bus turnaround DRAM which aims at improvements in device integration, power dissipation, and the cost as well as provides advantages of a conventional ZBT SRAM device having pin-outs, a timing and function sets similar to those of the SRAM. (refer to a reference 2 (patent document), for example).

Reference 2 (Patent Document 1):

JP Patent Kokai Publication JP-P2001-283587A (p. 2, FIG. 1)

A memory device described in the above reference 2 (Patent Document) includes a WAIT signal output pin for informing to a controller outside the memory device that a memory array is in a state which cannot be used for data access. The above reference2 (Patent Document), there is such a description that its object is to provide an enhanced bus turnaround DRAM with pin-outs, timing, and function sets similar to those of the ZBT SRAM device and having a lot of same advantages as the ZBT SRAM device. However, the device described in the reference 2 is not ZBT-SRAM compatible. That is, in the above reference 2, use of a two-port DRAM cell is not described, and a usual one-port DRAM cell is considered to be used. There is a need to always insert a refresh cycle between read/write cycles; and in the refresh cycle, read/write operations must be interrupted. When the DRAM is used in a communication application, specifications for enabling continuous read/write operations are required. In such a communication application, the conventional ZBT SRAM cannot be replaced by the enhanced bus turnaround DRAM described in the reference 2. In a paragraph number [0059] in a detailed description of the above reference 2, it is described that when the refresh cycle is hidden behind a readout cycle of a cache, an effect of almost every refresh cycle on an operation of the memory device is minimum. However, even if a frequency of making read/write requests is low, when the read/write requests for the memory array about data not on the cache became continuous, the read/write operations had to be interrupted using the WAIT pin and hence the ZBT SRAM cannot be replaced by the enhanced bus turnaround DRAM.

On the other hand, as shown in FIG. 13, there is known a dynamic random access memory (refer to a reference 3 (Patent Document 2), for example). This memory includes a cell array with a plurality of memory cells, which are two-port DRAM cells. In each two-port memory cell, first and second switch transistors 205 and 206 are connected in series between a bit line 201 for normal access and a bit line 202 for refresh only. A capacitor element 207 for data storage is connected to a connection node at which the first and second switch transistors 205 and 206 are tied. A word line 204 for normal access and a word line 203 for refresh only are connected to respective control terminals of the first and second switch transistors 205 and 206. In this memory, when an external memory access and a refresh have been made to an identical address, the refresh is masked.

There is also known a memory (refer to a reference 4 (Patent Document 3), for example). In this memory, the two-port DRAM cells shown in FIG. 13 are employed; and write-only bit lines and read-only bit lines are provided, and a read and a write are simultaneously performed. For a refresh, cell data is read from a read-only bit line, and amplified by a sense amplifier. Then, the cell data is written back through a write-only bit line.

Reference 3 (Patent Document 2):

JP Patent Kokai Publication JP-A-3-263685 (p. 2, FIG. 2)

Reference 4 (Patent Document 3):

JP Patent No. 2653689 (p. 3, FIG. 2)

SUMMARY OF THE DISCLOSURE

A device that uses conventional DRAM cells, similar to the ZBT SRAM, (also called as an "NoBL-SRAM") has been developed. In this device, it becomes necessary to deselect four clock cycles for each 16 $\mu$s for an internal refresh, for example; thus, it is not completely ZBT-SRAM-interface compatible (refer to a reference 5 (Non-patent Document 2), for example). The presence of a deselect period makes it difficult to increase access efficiency. Further, a semiconductor memory device using QDR-SRAM-interface compatible DRAM cells has not proposed.

Reference 5 (Non-Patent Document 2):

Enhanced Memory Systems Inc. Web Page Products News (Products News) [Searched on Oct. 10, 2002] Via Internet <URL :http://www.edram.com/products/datasheets/ss2625ds_rl.l.pdf (p. 6)>

Accordingly, it is an object of the present invention to provide a semiconductor memory device, which is interface compatible with a high-speed SRAM such as a QDR (Quad Data Rate) SRAM, and which improves efficiency of refresh control and speeds up the refresh control, and a control method thereof.

The above and other objects are attained by a semiconductor memory device in accordance with an aspect of the present invention, which is interface compatible with a static random access memory, wherein a cell array comprises DRAM (dynamic random access memory) cells as memory cells each having two ports comprising a port for a write system and a port for a read system, and which comprises:

an address holding circuit for holding an externally input address; and a control unit for comparing a refresh address output from a refresh address circuit with the address for write, and performing control so that when the refresh address does not match the address for write, a read or write operation using one of the ports for the write and read systems for one of the DRAM cells and a refresh operation using the other port are performed in parallel, and when the refresh address matches the address for write, the refresh operation is stopped.

A semiconductor memory device according to another (second) aspect of the present invention comprises:

a cell array including a plurality of memory cells, each of which comprises first and second switch transistors connected in series between a first bit line for a write system and a second bit line for a read system; and a capacitor for data storage, connected to a connection node at which the first and second switch transistors are tied, in which a first word line for write and a second word line for read being connected to respective control terminals of the first and second switch transistors;

an address holding circuit for holding an address input from an outside of the semiconductor memory device;

a first determination circuit for comparing a refresh address with a row address for the address selected according to a control signal commanding a read/write operation among read and write addresses held in the address holding circuit to determine whether the refresh address matches the row address for the address or not; and a control unit for performing control so that when a mismatch is detected as a result of the determination by the first determination means, the read or write operation and a refresh operation are concurrently performed during a same cycle, in which the read or write operation being performed using the word line and the bit line for one of the read and write systems for the memory cell selected by the read or write address, while the refresh operation being performed using the word line and the bit line for the other of the read and write systems for the memory cell selected by the refresh address and a sense amplifier for the other of the read and write systems, and when the match is detected as the result of the determination, the refresh operation is inhibited and the read or write operation using the word line and the bit line for one of the read and write systems for the memory cell selected by the read or write address is performed.

A semiconductor memory device according to still another (third) aspect of the present invention comprises:

a cell array including a plurality of memory cells, each of which comprises: first and second switch transistors connected in series between a first bit line for a write system and a second bit line for a read system; and a capacitor for data storage, connected to a connection node at which the first and second switch transistors are tied; in which a first word line for write and a second word line for read being connected to respective control terminals of the first and second switch transistors;

a address holding circuit for holding a row address for an address for writing input from an outside of the semiconductor memory device;

a first determination circuit for comparing a refresh address with the row address for the address for write held in the address holding means to determine whether the refresh address matches the row address for the address for write or not; and a control unit for performing control so that when a mismatch is detected as a result of the determination by the first determination circuit, a write operation and a refresh operation are performed in parallel during a same cycle, in which the write operation is performed using the word line and the bit line for write for the memory cell selected by the address for write, while the refresh operation is performed using the word line and the bit line for read for the memory cell selected by the refresh address and a sense amplifier for read, and when the match is detected as the result of the determination, the refresh operation is inhibited, and the write operation is performed.

The semiconductor memory device according to the present invention comprise a second determination circuit for determining whether the address input to the semiconductor memory device from the outside of the semiconductor memory device matches the write address held in the address holding circuit; and a control circuit for performing control so that when a read address matches the write address held in the address holding circuit as a result of the determination by the second determination circuit, data held in a data holding circuit is output from a readout data output terminal.

In the semiconductor memory device according to the present invention, the first determination circuit compares the refresh address with the row address of the write address to determine whether the refresh address matches the row address of the write address before a cycle of performing the write operation to the cell array is started.

In the semiconductor memory device according to the above described second aspect of the present invention, the address holding circuit preferably comprises:

a first address holding circuit for holding the row address of the write address (referred to as a "row address for write") input from an address terminal, delaying the row address for write by a predetermined number of write cycles for supply, and outputting the row address for the read address (referred to as a "row address for read") input from the address terminal without delay; and a second address holding circuit for holing a column address for the write address (referred to as a "column address for write") input from the address terminal, delaying the column address for write by the predetermined number of write cycles for supply, and outputting a column address for the read address (referred to as a "column address for read") input from the address terminal without delay.

The first address holding circuit preferably comprises at least one match detection circuit for determining whether the row address for the address input from the address terminal matches the row address of the write address held in the first address holding circuit.

The second address holding circuit preferably comprises at least one match detection circuit for determining whether the column address for the address input from the address terminal matches the column address for the write address held in the second address holding circuit.

In the semiconductor memory device according to the above-described third aspect of the present invention, the address holding circuit preferably comprises:

a first address holding circuit for holding the row address of the write address (referred to as a "row address for write") input from an address terminal, delaying the row address for write by a predetermined number of write cycles for supply, and outputting a row address of a read address signal (referred to as a "row address for read") input from the address terminal without delay; and a second address holding circuit for holding a column address of the write address signal (referred to as a "column address for write") input from the address terminal, delaying the column address for write by the predetermined number of write cycles for supply, and outputting a column address of the read address signal (referred to as a "column address for read") input from the address terminal without delay.

The first address holding circuit preferably comprises: a first match detection circuit for comparing the row address for write with the refresh address to determine whether the row address for write matches the refresh address before delaying the row address for write by the predetermined number of write cycles for supply; and at least one second match detection circuit for determining whether the row address for the address input from the address terminal matches the row address of the write address held in the first address holding circuit.

The second address holding circuit preferably comprises:

at least one match detection circuit for determining whether the column address for the address input from the address terminal matches the column address for the write address held in the second address holding circuit; and the first match detection circuit in the first address holding circuit constitutes the first determination circuit.

A method, in accordance with one aspect of the present invention which is the method of controlling a semiconductor memory device with a cell array thereof comprising DRAM (dynamic random access memory) cells as memory cells each having two ports comprising a port for a write system and a port for a read system, the semiconductor memory device having an auto refreshing function and being interface compatible with a static random access memory, comprises the steps of:

storing and holding an externally input address in an address holding circuit;

comparing a refresh address output from refresh address generation circuit with the address held in the address holding circuit;

performing control so that when the refresh address does not match the address, a read or write operation using one of the ports for the write and read systems for one of the DRAM cells and a refresh operation using the other of the ports for the write and read systems are concurrently performed; and performing control when the refresh address matches the address for write, the refresh operation is stopped.

A method, in accordance with another aspect of the present invention, which is the method of controlling a semiconductor memory device comprising a cell array including a plurality of memory cells, each of the memory cells comprising:

first and second switch transistors connected in series between a first bit line for a write system and a second bit line for a read system; and a capacitor for data storage, connected to a connection node at which the first and second switch transistors are tied;

a first word line for write and a second word line for read being connected to respective control terminals of the first and second switch transistors; and an address holding circuit for holding an address input from an outside of the semiconductor device;

the method comprising the steps of:

comparing a refresh address with a row address for the address selected according to a control signal commanding a read/write operation among read and write addresses held in the address holding circuit to determine whether the refresh address matches the row address for the address or not;

performing control so that when a mismatch is detected as a result of the determination, the read or write operation and a refresh operation are concurrently performed during a same cycle, the read or write operation being performed using the word line and the bit line for one of the read and write systems for the memory cell selected by the read or write address, the refresh operation being performed using the word line and the bit line for the other of the read and write systems for the memory cell selected by the refresh address and a sense amplifier for the other of the read and write systems; and performing control so that when the match is detected as the result of the determination, the refresh operation is inhibited, and the read or write operation using the word line and bit line for one of the read and write systems for the memory cell selected by the read or write address is performed.

A method according to other aspect of the present invention may comprise the steps of:

comparing a refresh address with the row address for the address for write held in the address holding circuit to determine whether the refresh address matches the row address for the address for write or not;

performing control so that when a mismatch is detected as a result of the determination, a write operation and a refresh operation are concurrently performed during a same cycle, wherein the write operation being performed using the word line and the bit line for write for the memory cell selected by the address for write, while the refresh operation being performed using the word line and the bit line for read for the memory cell selected by the refresh address and a sense amplifier for read; and performing control so that when the match is detected as the result of the determination, the refresh operation is inhibited, and the write operation is performed.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
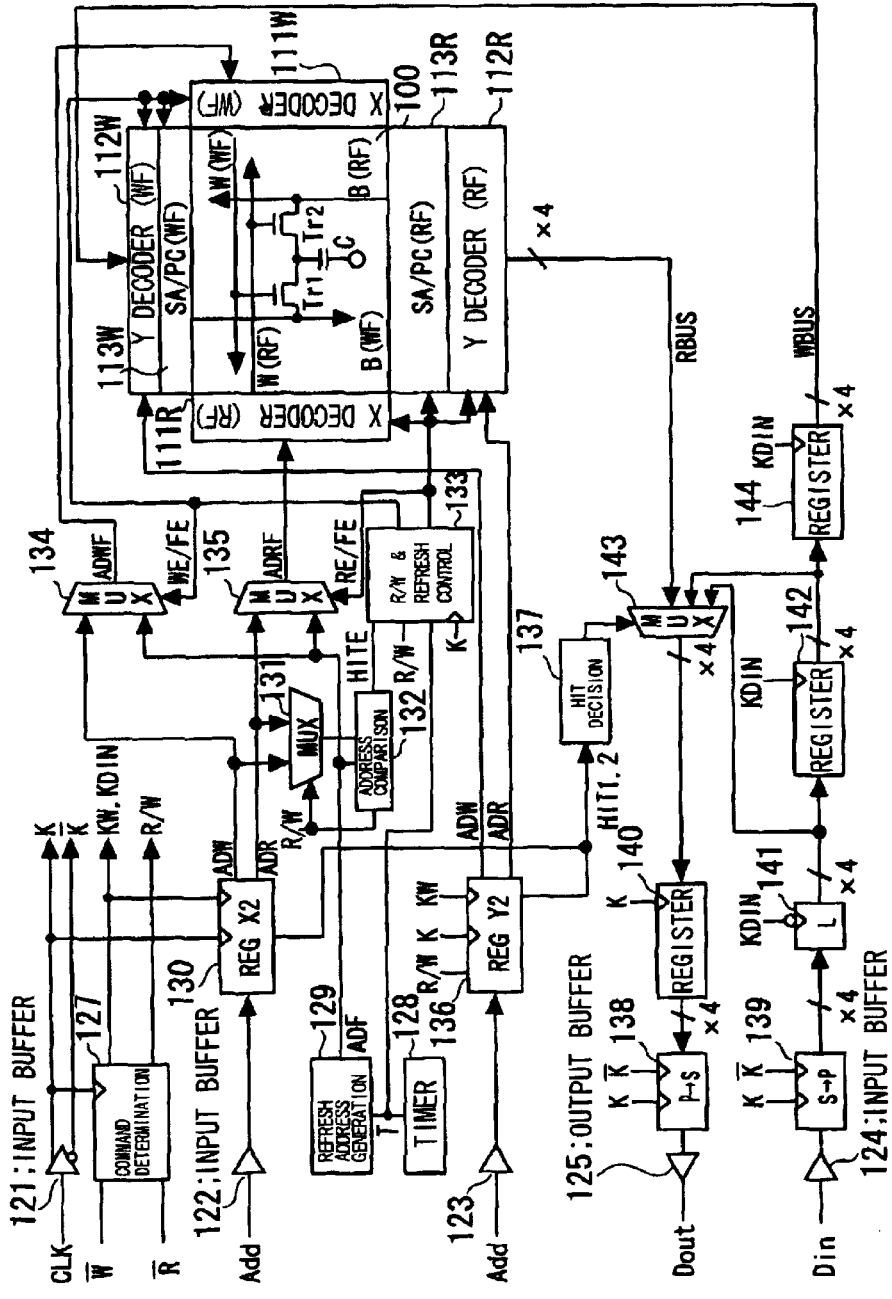
FIG. 1 is a diagram showing a cell array and an overall configuration of a semiconductor memory device according to an embodiment of the present invention.

Embodiment modes of the present invention will be described. Referring to FIG. 1, in a semiconductor memory device of the present invention in a preferred embodiment mode, each memory cell includes first and second switch transistors (Tr1, Tr2) connected between a bit line (B(WF)) for a write system and a bit line (B(RF)) for a read system and a capacitor (C) for data storage which is connected to a connection node at which the first and second switch transistors are tied (Tr1, Tr2). A word line (W(WF)) for a write system and a word line (W(RF)) for a read system are connected to control terminals of the first and second switch transistors (Tr1, Tr2), respectively.

The semiconductor memory device includes: address holding means (130, 136) for holding an input address signal: and first determination means (132) for comparing a refresh address with a row address of a read address or a write address output from the address holding means (130), which is selected by a read/write control signal.

If a mismatch has been detected as a result of determination by the first determination means (132), a read/write operation using one of the read and write systems, which is selected by the read address or the write address, and a refresh operation using the other of the read and write systems, which is selected by the refresh address are performed in parallel during a same cycle.

If they match, the refresh operation is inhibited and the read and/or write operation using the read system and/or the write system are performed.

The semiconductor memory device has a late-write configuration, in which, writing data to a memory cell selected by a write address is performed with a delay of a predetermined number of write cycles exceeding one as from the time when the write address are externally supplied.

The semiconductor memory device according to the present invention in the preferred embodiment includes:

second determination means (308 or 309 in FIG. 2) for determining whether the address input from an outside of the semiconductor memory device matches the write address held in the address holding means (130, 136); and a control means (137, 143 in FIG. 1) for performing control so that when the read address matches the write address held in the address holding means as a result of the determination by the second determination means, data held in data holding means (141, 142 in FIG. 1) is output from a data output terminal (Dout) as read data.

According to the embodiment mode of the present invention, the address holding means includes:

a first address holding circuit (130) for holding the row address of a write address (referred to as a "row address for write") supplied from an address terminal and delaying the write address by the predetermined number of write cycles to output the delayed write address, and for outputting the row address of a read address (referred to as a "row address for read") supplied from the address terminal without delay; and a second address holding circuit (136) for holding a column address of the write address (referred to as a "column address for write") supplied from the address terminal, delaying the write address by the predetermined number of write cycles to output the delayed write address, and for outputting the column address of the read address (referred to as a "column address for read") supplied from the address terminal without delay.

The semiconductor memory device further includes: a first selection circuit (131), an address comparison circuit (132), a read/write and refresh control circuit (133), a second selection circuit (134), and a third selection circuit (135).

The first selection circuit (131) receives the row address from an output terminal of the first address holding circuit (130), selects and outputs the row address for read when the control signal commanding the read/write operation indicates a read, and selects and outputs the row address for the write system when the control signal indicates a write.

The address comparison circuit (132) compares the row address output from the first selection circuit (131) with a refresh address output from the refresh address generation circuit.

The read/write and refresh control circuit (133) outputs a refresh control signal for a read system and a refresh control signal for a write system, for controlling refreshing, using either of the address for a write system and the address for a read system, based on the result of the comparison from the address comparison circuit (132) and the control signal commanding the read/write operation.

The second selection circuit (134) receives the row address for write output from the first address holding circuit, the refresh address output from the refresh address generation circuit (129), and the refresh control signal for a write system from the read/write and refresh control circuit (133) as a selection control signal, selects and outputs the refresh address when the refresh control signal for a write system is activated, and selects and outputs the row address for write when the refresh control signal for a write system is deactivated.

The third selection circuit (135) receives the row address for read output from the first address holding circuit (136), the refresh address output from the refresh address generation circuit (129), and the refresh control signal for a read system from the read/write and refresh control circuit (133) as the selection control signal, selects and outputs the refresh address when the refresh control signal for a read system is activated, and selects and outputs the row address for read when the refresh control signal for a read system is deactivated.

The semiconductor memory device further includes a first X decoder (111W), a second X decoder (111R), a first Y decoder (112W), a first sense amplifier (113W), a second Y decoder (112R), and a second sense amplifier (113R).

The first X decoder (111W) receives the row address from the second selection circuit (134), decodes the row address, and selects a first word line for a write system.

The second X decoder receives the row address from the third selection circuit (135), decodes the row address, and selects a second word line for a read system.

The first Y decoder (112W) receives the column address for write output from the second address holding circuit (136), and activation of the first Y decoder (112W) is controlled by the refresh control signal for the write system from the read/write and refresh control circuit (133).

The first sense amplifier (113W) is connected to the bit line for a write system and its activation is controlled by the refresh control signal for a write system from the read/write and refresh control circuit (133).

The second Y decoder (112R) receives the column address for read from the output terminal of the second address holding circuit (136), and activation of the second Y decoder (112R) is controlled by the refresh control signal for a read system from the read/write and refresh control circuit (133).

The second sense amplifier (113R) is connected to the bit line for a read system. Activation of the second sense amplifier (113R) is controlled by the refresh control signal for a read system from the read/write and refresh control circuit (133).

The semiconductor memory device according to the preferred embodiment may be configured as follows: A refresh address is compared with the row address of a write address held in the address holding circuit to determine whether they match. If a mismatch has been detected as the result of the determination, control is performed so that a write operation using a word line and a bit line for a write system for a memory cell selected by the write address and a refresh operation using a word line and a bit line for a read system and the sense amplifier for a read system for a memory cell selected by the refresh address is performed concurrently during the same cycle. If they match as the result of the determination, control is performed so that the refresh operation is inhibited, and the write operation is performed.

The present invention may be so configured that a refresh address is compared with the row address of a write address to determine whether they match before a start of the cycle where a write operation on the cell array is performed.

According to another embodiment of the present invention, a first address holding circuit (130A) includes a match detection circuit (322) for comparing a row address for write with a refresh address to verify whether they match at the timing before the row address is delayed by the predetermined number of write cycles and output.

The first address holding circuit (130A) includes a latch circuit (311) in an input stage, for sampling a row address of an address signal supplied from the address terminal with an internal clock signal;

an write address holding circuit configured by connecting a plurality of latch circuits in cascade, each of the latch circuits sampling a signal at its input terminal to output the sampled signal from an output terminal in response to a clock signal for write control activated during a write cycle, in which a latch circuit of a first stage receives an output signal of the latch circuit (311) in the input stage at its input terminal and a latch circuit of a last stage delays the output signal of the latch circuit in the input stage by the predetermined number of write cycles from its output terminal, a match detection circuit (322) which compares the output signal of the latch circuit arranged in a stage preceding to the last stage of the write address holding circuit with a refresh address signal to verify whether they match;

at least one match detection circuit (320, 321) for comparing the output signal of the latch circuit in a stage preceding the last stage of the latch circuits of the write address holding circuit with the output signal of the latch circuit in the input stage to determine whether they match, and a selection circuit (318) which receives a refresh address and an output of the latch circuit in the input stage, selects the refresh address for supply when the refresh control signal is activated, and selects the output of the latch circuit in the input stage when the refresh control signal is deactivated for supply, using the refresh control signal as the selection control signal.

In the present invention, the read/write and refresh control circuit (133) receives the result of determination by the match detection circuit (322) in the first address holding circuit (130A) and performs control so that if there is even one unmatching bit between the row address for write and the refresh address, a first refresh control signal for controlling the refresh operation is activated, and the write operation using the word line and the bit line for a write system selected by the address for a write system and the refresh operation using the word line, the bit line, and the sense amplifier for a read system selected by the refresh address are concurrently performed during the same cycle.

The semiconductor memory device according to the embodiment mode of the present invention includes a timer (128 in FIG. 1) for generating a trigger signal defining a refresh cycle and the refresh address generation circuit (129 in FIG. 1) for generating a refresh address based on the trigger signal from the timer, has a self-refresh function, and is interface compatible with a clock synchronous type static random access memory.

In the semiconductor memory device according to the embodiment modes of the present invention, two-port DRAM cells preferably are adopted and hence a read/write and a refresh can be performed simultaneously. For this reason, in the semiconductor memory device according to the embodiment of the present invention, the read/write operation can be alternately and continuously performed without interruption caused by the refresh. Accordingly, the present invention is applicable as a QDR SRAM-compatible semiconductor memory device for high-performance communications applications in which specifications capable of alternately performing read and write operations are required.

As mentioned in the above, there is no description about use of the two-port DRAM cell in the above-mentioned reference 2 (Patent Document 1). Thus, there is a need to always insert a refresh cycle between read write/cycles, so that replacement by a conventional QDR SRAM for the communications use cannot be performed.

[Embodiments]

Embodiments of the present invention will be described with reference to drawings in more detail. FIG. 1 is a diagram showing a clock synchronous type semiconductor memory device according to an embodiment of the present invention. A cell array is composed by DRAM cells and is suitable for being interface compatible with a clock synchronous type SRAM compliant with QDR (Quad Data Rate) specifications, for example.

Referring to FIG. 1, in a cell array 100 having a plurality of memory cells, each memory cell includes first and second memory cell transistors (switch transistors) Tr1 and Tr2 connected in series between a bit line B(WF) for a write system and a bit line B(RF) for a read system and a capacitor element C for data storage. One end of the capacitor element C is connected to a connection point between the first and second memory cell transistors Tr1 and Tr2, and an other end of the capacitor element C is connected to a GND potential. Gate terminals of the first and second memory cell transistors Tr1 and Tr2 are connected to a word line W(WF) for a write system and a word line W(RF) for a read system, respectively.

The first word line W(WF) is connected to a word driver (not shown) of a first X decoder (WF) 111W which decodes a row address of a write address or a refresh address. The second word line W(RF) is connected to the word driver (not shown) of a second X decoder (RF) 111R which decodes the row address of a read address or a refresh address.

The first and second X decoders 111W and 111R are arranged to be opposite to each other with the cell array 100 interposed therebetween.

The first bit line B(WF) is connected to a first sense amplifier/pre-charging circuit 113W, while the second bit line B(RF) is connected to a second sense amplifier/pre-charging circuit 113R. The first and second sense amplifiers 113W and 113R are arranged to be opposite to each other (at top and bottom of a drawing) with the cell array 100 interposed therebetween.

An input buffer 121 that receives a clock signal CLK supplied to a clock terminal of the semiconductor memory device from an outside of the semiconductor memory device generates and outputs an internal clock signal K and its complementary signal /K (in a drawing, a bar mark over a signal name indicates the complementary signal of a signal having the signal name).

An input buffer 122 that receives the row address indicated by an address signal Add supplied to an address terminal of the semiconductor memory device from the outside of the semiconductor memory device outputs a row address AddE.

A command decision circuit 127 receives, a read signal /R and a write signal /W, each of which is active at a LOW level, and the internal clock signal K, decodes a command, and outputs a read/write control signal R/W, a clock signal KW, and a clock signal KDIN.

A timer 128 generates a refresh trigger signal (also termed a "trigger signal") for defining a refresh cycle.

A refresh address generation circuit 129 is composed by a counter which increments a count value by one upon reception of the trigger signal T from the timer 128, for example. The count value is output as a refresh address ADF.

A register (REG X2) 130 receives the row address of an external address from the input buffer 122 and the clock signals K and KW, and holds and outputs a write address ADW and a read address ADR.

A multiplexer 131 receives the write address ADW and the read address ADR output from the register (REG X2) 130, receives the read/write control signal R/W as a selection control signal, and selects and outputs one of the write address ADW and the read address ADR.

An address comparison circuit 132 receives the row address of the read or write address supplied from the multiplexer 131 and the refresh address supplied from the refresh address generation circuit 129, makes comparison between these two addresses to determine whether they match or not.

A comparison result by the address comparison circuit 132 is output as a signal HITE and supplied to a R/W and refresh control circuit 133.

The R/W and refresh control circuit 133 receives the signal HITE indicating the result of the comparison by the address comparison circuit 132, trigger signal T from the timer 128, read/write control signal R/W, and internal clock signal K, and outputs a refresh control signal WE/FE for a write system and a refresh control signal RE/FE for a read system.

The refresh control signal WE/FE for a write system controls a refresh operation or a write operation using the decoder and sense amplifier for a write system, while the refresh control signal RE/FE for a read system controls the refresh operation or a read operation using the decoder and sense amplifier for a read system.

The register (REG X2) 130 activates a first match detection signal (a first hit signal) HIT1 when a row address input externally matches the row address input one write cycle earlier and held in the register 130, and activates a second match detection signal (a second hit signal) HIT2 when the row address input externally matches the row address input two write cycles earlier and held in the register 130.

A register (REG Y2) 136, which receives an output (a column address) of an input buffer 123 for receiving an address signal supplied to the address terminal (not shown), receives the read/write signal R/W and the signal (write control clock signal) KW, delays the write address (column address) ADW by two write cycles. The register (REG Y2) 136 outputs the delayed write address to a Y decoder 112W and outputs the read address (column address) ADR to a Y decoder 112 R without delay.

Like the register 130, the register 136 activates the first match detection signal HIT1 when a column address externally input is the same as the column address supplied one write cycle earlier, and activates the second match detection signal HIT2 when the column address externally input is the same as the column address supplied two write cycles earlier.

A HIT decision circuit 137 receives respective signals of the first match detection signal HIT1 and the second match detection signal HIT2 about the row and column addresses from the registers 130 and 136 and outputs the selection control signal to a multiplexer 143 for selecting data to be supplied to a circuit that outputs read data.

A data signal (write data) output serially from an input buffer 124 connected to a data input pin Din is sampled by a serial-to-parallel conversion circuit 139 that uses the clock signal K and the complementary clock signal /K as sampling clocks. Four bits parallel signals output from the serial-to-parallel conversion circuit 139 are sampled by a register 141 at a fall edge of the clock signal KDIN. Output signals of the register 141 are sampled by a register 142 at a rise edge of the clock signal KDIN. Four bits output signals from the registers 141 and 142 are supplied to two respective terminals of the multiplexer 143.

The multiplexer 143 selects one of the outputs of a read bus RBUS and the registers 141 and 142 according to the selection control signal.

The output signals of the register 144 that samples the output signals of the register 142 at a rise of the clock signal KDIN are supplied to the Y decoder 112W through a write bus WBUS.

When the first match detection signals HIT1 from the registers 130 and 136 are both activated and the read address is the same as the one for an immediately preceding write cycle, selection control is performed by the multiplexer 143 so that the outputs of the register 141 are selected, based on the selection control signal from the HIT decision circuit 137.

When the second match detection signals HIT2 from the registers 130 and 136 are both activated and the read address is the same as the one two write cycles earlier, selection control is performed at the multiplexer 143 so that the outputs of the register 142 are selected, based on the selection control signal from the HIT decision circuit 137.

In a read cycle where the first match detection signal HIT1 and the second match detection signal HIT2 are both deactivated, control is performed by the multiplexer 143 so that read data output onto the read bus RBUS via the sense amplifier 113R and the Y decoder 112R is selected, based on the selection control signal from the HIT decision circuit 137.

The output signals (four bits parallel signals) of the multiplexer 143 are supplied to the register 140 and are parallel-to-serial converted using the internal clock signal K and its complementary signal /K by a parallel-to-serial conversion circuit 138. Four pieces of data per clock cycle are output from an output buffer 125 to a data output terminal Dout.

An overview of an operation of this embodiment will be described. The registers 130 and 136 receive write addresses from the input buffer 122 and 123 respectively and delay the write addresses by two write cycles to output the delayed write addresses.

When the address signal selected from the signals from the register 130 by the multiplexer 131 does not match the refresh address (or more specifically, when there is even one bit among m bit signals of the row address does not match the refresh address signal), the read/write and refresh control circuit 133 activates the refresh control signal WE/FE for a write system if the R/W signal indicates a read. If the R/W signal indicates a write, the read/write and refresh control circuit 133 activates the refresh control signal RE/FE for a read system.

When the write operation is performed, the operation of writing data, which is associated with the write address that has been input two write cycles earlier, to a memory cell, and the operation of refreshing a memory cell using the X decoder 111R for a read system, the bit line B(RF) for a read system, and the sense amplifier SA/PC(RF) 113R for a read system are simultaneously performed. The data associated with the write address is input from the data input terminal Din two write cycles earlier, output from the register 144, and supplied to the Y decoder 112W through the write bus WBUS. The operation of writing the data is performed by using the X decoder 111W for a write system, the bit line B(WF) for a write system, and the sense amplifier (write amplifier) SA/PC (WF) for a write system.

As described before, the register 130 makes the first match detection signal HIT1 or the second match detection signal HIT2 active when an externally input address (row address) matches a write address (row address) held in the register 130 and externally input one or two write cycles earlier, respectively. The register 136 makes the first match detection signal HIT1 or the second match detection signal HIT2 active when an externally input address (column address) matches a write address (column address) held in the register 136 and externally input one or two write cycles earlier.

When the first match detection signal HIT1 and the second match detection signal HIT2 from the registers 130 and 136 are both deactivated in a read cycle, the HIT decision circuit 137 causes the multiplexer 143 to selectively output read data which have been output onto the read bus RBUS. The output signal of the multiplexer 143 is latched by the register 140, parallel-to-serial-converted by the parallel-to-serial-converter, and output to the data output terminal Dout by the output buffer 125.

When row and column addresses for a write address input one or two write cycles earlier match the row and column addresses for a read address externally input, the HIT1 or the HIT2 signals from the registers 130 and 136 are activated. When the first match detection signals HIT1 are activated, the HIT decision circuit 137 causes the multiplexer 143 to select write data held in the register 141 as read data. On the other hand, when the second match detection signals HIT2 are activated, the HIT decision circuit 137 causes the multiplexer 143 to select write data held in the register 142 as the read data. The output signal of the multiplexer 143 is latched by the register 140, parallel-to-serial converted, and output to the data output terminal Dout through the output buffer 125.

Figure 2:
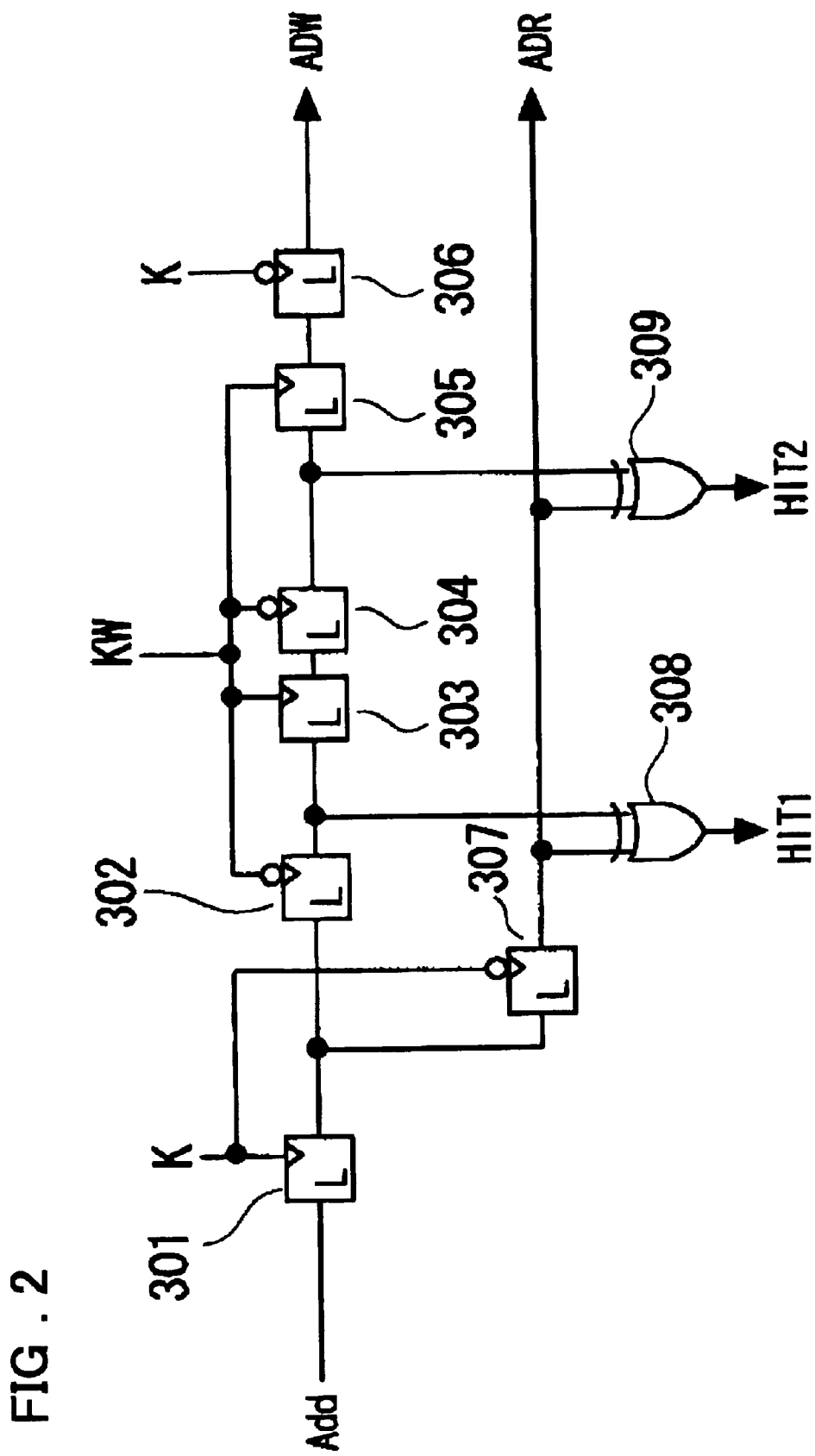
FIG. 2 is a diagram showing a configuration of a register (REG X2) according to the embodiment of the present invention.

Some examples of a configuration of the register 130 in FIG. 1 will be described below. FIG. 2 is a diagram showing an example of the configuration of the register 130 in FIG. 1.

Referring to FIG. 2, the register 130 includes latch circuits 301, 302, 303, 304, 305, 306, and 307. The latch circuit 301 samples the external address Add (row address) at a rise edge of the internal clock signal K. The latch circuit 302 latches the output signal of the latch circuit 301 at a fall edge of the write control clock signal KW (that occurs during a same cycle as for the rise of the internal clock signal K). The latch circuit 303 latches the output signal of the latch circuit 302 at the rise edge of the write control clock signal KW (in a next write cycle after the fall of the clock signal KW). The latch circuit 304 latches the output signal of the latch circuit 303 at the fall edge of the write control clock signal KW. The latch circuit 305 latches the output signal of the latch circuit 304 at the rise edge of the write control clock signal KW. The latch circuit 306 latches the output signal of the latch circuit 305 at the fall of the internal clock signal K. The latch circuit 307 latches the output signal of the latch circuit 301 at the fall of the internal clock signal K. The outputs of the latch circuits 306 and 307 are output as the address signals ADW and ADR, respectively. This register 130 (refer to FIG. 1) further includes match detection circuits 308 and 309.

The match detection circuit 308 compares the output signal of the latch circuit 307 which samples the output signal of the latch circuit 301 at the fall of the internal clock signal K with the output signal of the latch circuit 302 which samples the output signal of the latch circuit 301 at the fall edge of the write control clock signal KW to detect whether they match with each other or not. When the match has been detected, the match detection circuit 308 outputs a LOW level signal.

The match detection circuit 309 compares the output signal of the latch circuit 307 with the output of the latch circuit 304 (the write address two cycles earlier) to detect whether the output signal matches the output or not. When the match has been detected, the match detection circuit 309 outputs a LOW level signal.

The outputs of the latch circuits 308 and 309 are output as the first match detection signal HIT1 and the second match detection signal HIT2 respectively.

The latch circuit 301 latches the address Add at the rise of the internal clock signal K from the LOW to the HIGH level. The latch circuits 306 and 307 in output stages sample their respective input signals at the fall of the internal clock signal K from the HIGH level to the LOW level during the same cycle to output the sampled signals.

In this case, a set of latch circuits 302, 303, 304 and 305, of which the latch circuits 302 and 304 sample data at the fall edge of the clock signal (KW) for write control and the latch circuits 303 and 305 sample data at the rise edge of the clock signal (KW) for write control, function as a write address holding circuit for timing adjustment, which delays the write address by two write cycles according to specifications for a late write. The latch circuit 305 in a final stage which constitutes the write address holding circuit outputs the write address at the rise of the write control clock signal KW, at a time point delayed by two write cycles after the write address has been sampled at the latch circuit 301. The latch circuit 306 outputs the address ADW at the rise of the internal clock signal K during this write cycle.

Next, an operation of the register (indicated by reference numeral 130 in FIG. 1) shown in FIG. 2 will be described. At a time of a read operation, no clock pulse of the clock signal KW is generated (and the clock signal is held at the LOW level, for example), and the output of the latch circuit 301 is not transferred to the four latch circuits 302, 303, 304, and 305.

The match detection circuit 308 compares the output of the latch circuit 302 (write address one write cycle earlier) with the output of the latch circuit 307 (address input during a current cycle) to detect whether they match or not. If the match has been detected, the match detection circuit 308 outputs the LOW level. If a mismatch has been detected, the match detection circuit 308 outputs the HIGH level.

The match detection circuit 309 compares the output of the latch circuit 304 (write address two write cycles earlier) with the output of the lat circuit 307 (address during the current cycle) to detect whether they match or not. If the match has been detected, the match detection circuit 309 outputs the LOW level. If a mismatch has been detected, the match detection circuit 309 outputs the HIGH level.

In FIG. 2, the input to the latch circuits 301 to 307 and the match detection circuits 308 to 309, is shown as a single signal line, only for simplicity. However, signal lines, the number of which corresponds to a bit width of row address signals (such as m signal lines) are respectively input to these circuits.

The register 136, which latches a column address and supplies the write address ADW to the Y decoder 112W and the read address ADR to the Y decoder 112R, also has the same structure as in FIG. 2.

Figure 3:
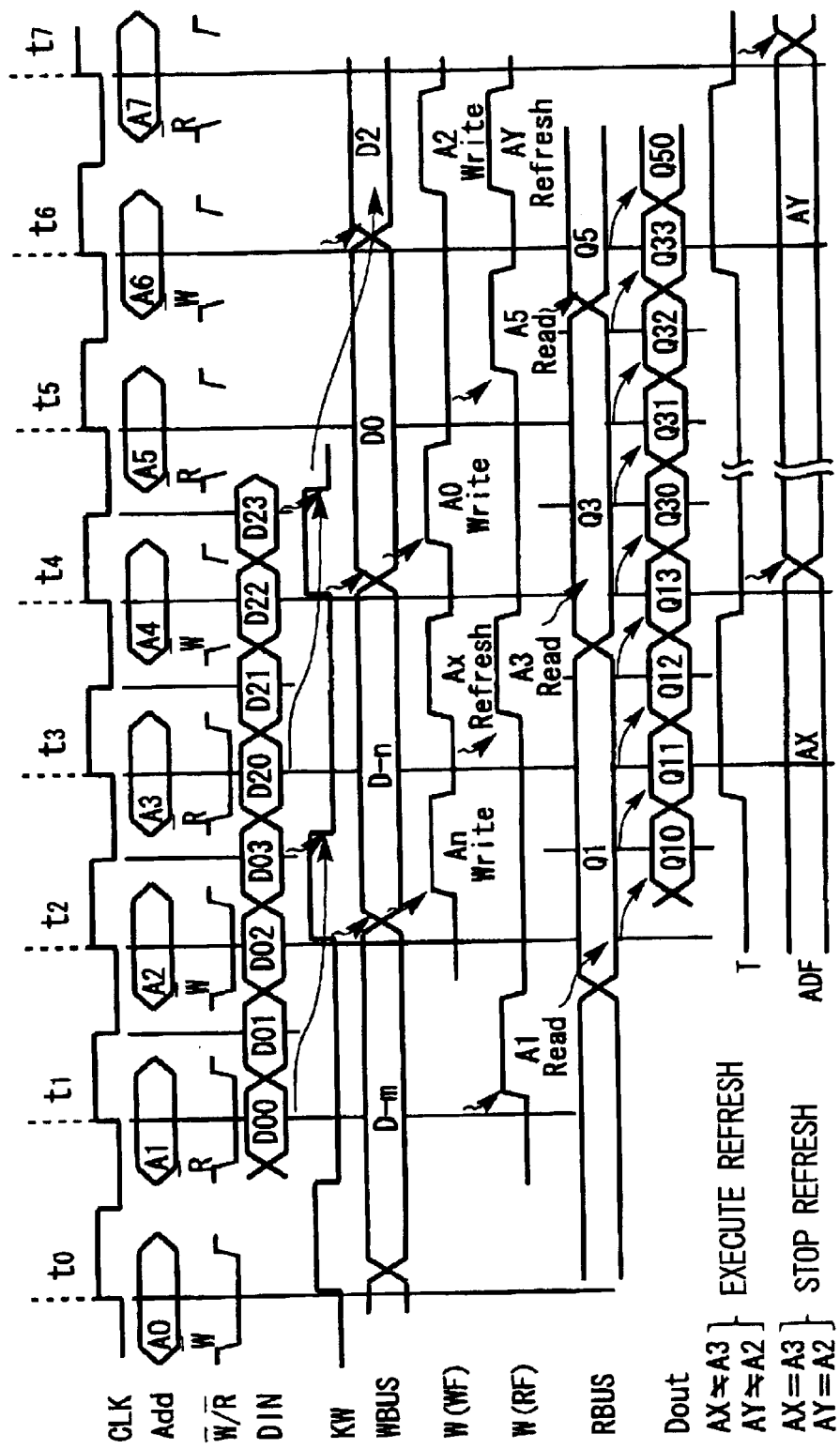
FIG. 3 is a timing diagram for explaining an operation of the embodiment of the present invention.

FIG. 3 is a timing diagram for explaining the operation of the semiconductor memory device shown in FIG. 1. Referring to FIG. 3, CLK denotes the clock signal supplied to the input buffer 121, Add denotes the address signal supplied to the input buffer 122 in FIG. 1, R/W denotes the read/write control signal, DIN denotes the data signal input from the data input terminal, KW denotes the write clock signal, WBUS denotes (parallel data on the) write bus, W(WF) denotes a word line for a write system, W(RF) denotes a word line for a read system, RBUS denotes the (parallel data on the) read bus, Dout denotes output data from the data output terminal, T denotes the refresh trigger signal, and ADF denotes the refresh address signal.

It is assumed that a write cycle and a read cycle are alternatively performed when the external row address Add is A0, A1, A2, and A7, wearers the refresh address AddF is assumed to be An−1, An, and so on.

During one clock cycle, two pieces of data are input from the DIN terminal at both of the rise and fall edges of the clock signal. During two clock cycles, four pieces of data D00, D01, D02, and D03 (indicated by D0 on the WBUS) are output onto the write bus WBUS in response to the signal KW for write control obtained by frequency dividing the internal clock signal K by two. During the clock cycle starting from a timing t4, the writing data to cell at the address A0 which has been input from the address terminal during the cycle including a timing t0, is performed.

During a clock cycle starting at a timing t1, reading of cell data at the address A1 is performed. During a clock cycle starting at a timing t2, four bits data (Q1) are output in parallel onto the read bus RBUS. During two clock cycles, four pieces of read data Q10, Q11, Q12, and Q13 are output serially from the data output terminal Dout.

During a clock cycle starting at a timing t3, reading of cell data at an address A3 is performed. During a clock cycle starting at a timing t4, four bits of data (Q3) are output in parallel onto the read bus RBUS. During two clock cycles, four readout data Q30, Q31, Q32, and Q33 are output serially from the data output terminal Dout.

During a clock cycle starting at a timing t5, reading of cell data from an address A5 is performed during the same clock cycle, and read data Q5 (four bits) is output onto the read bus. During a clock cycle starting at a timing t6, readout data Q50 is output from the data output terminal Dout.

During a clock cycle starting at the timing t3, the refresh operation on a refresh address Ax using a port for a write system and the read operation using the read system are performed during the same cycle.

During a clock cycle starting at a timing t6, the write operation on the address A2 and the refresh operation on an address AY using the port for a read system are performed during the same cycle.

Control is performed by the read/write and refresh control circuit 133 so that the selected word lines W(WF) and the W(RF) rise simultaneously. This control is preferably done in order to cause the power supply noise resulting from a start of the operation of the sense amplifier 113W not to affect a potential of the bit line B(RF) before the bit line B(RF) is amplified by the sense amplifier 113R and to cause the power supply noise resulting from the start of the sense amplifier 113R not to affect the potential of the bit line B(WF) before the bit line B(WF) is amplified by the sense amplifier 113W.

When the refresh address AX does not match the external row address A3 (AX≠A3) during the read cycle, the word line W(RF) for reading is activated, and reading by the sense amplifier 113R connected to the bit line B(RF) is performed. Further, the refresh control signal WE/FE is activated to command a refresh. Then, the word line W (WF) for a write system, associated with the refresh address AX is activated, and the refresh operation by activation of the sense amplifier 113W is performed using a port for a write system.

On the other hand, when the refresh address AX matches the external row address A3 during the read cycle, the refresh operation is canceled.

When the refresh address AY does not match the external row address A2 (AY≠A2) during the write cycle, the word line W(WF) for a write system is activated, and writing by the sense amplifier 113W connected to the bit line B(WF) is performed. Further, the refresh control signal RE/FE is activated, and the word line (RF) for a read system, associated with the refresh address AY is activated. A refresh by activating the sense amplifier 113R is performed using the port for a read system. When the refresh address AY matches the external address A2 (AY=A2) during the write cycle, the refresh operation is cancelled.

Figure 4:
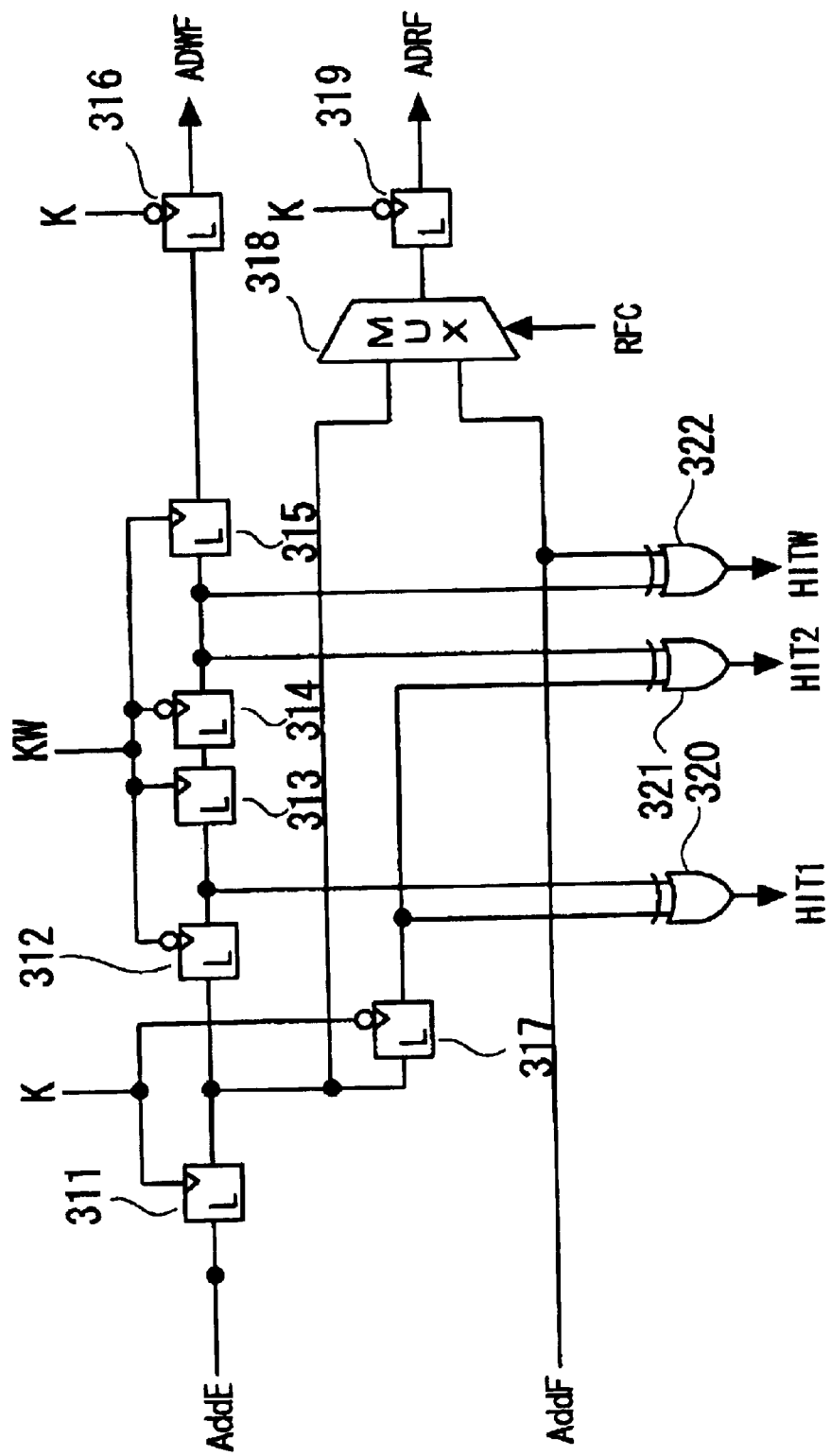
FIG. 4 is a diagram showing a configuration of a register (REG 3X) according to a second embodiment of the present invention.

FIG. 4 is a diagram showing another configuration of the register 130 in FIG. 1. Referring to FIG. 4, the register includes a latch circuit 311 which samples the external address AddE at the rise edge of the internal clock signal K, a latch circuit 317 which samples the output signal of the latch circuit 311 at the fall edge of the internal clock signal K, a latch circuit 312 which samples the output signal of the latch circuit 311 at the fall edge of the write control clock signal KW, a latch circuit 313 which samples the output signal of the latch circuit 312 at the rise edge of the write control clock signal KW, a latch circuit 314 which samples the output signal of the latch circuit 313 at the fall edge of the write control clock signal KW, a latch circuit 315 which samples the output signal of the latch circuit 314 at the rise edge of the write control clock signal KW, and a latch circuit 316 which samples the output signal of the latch circuit 315 at the fall of the internal clock signal K. The register includes a multiplexer 318 that receives the output signal of the latch circuit 311 and the refresh address AddF, selects the refresh address AddF when a refresh control signal RFC is activated (when a refresh is indicated), and selects the output signal of the latch circuit 311 when the refresh control signal RFC is deactivated, and a latch circuit 319 which samples the output signal of the multiplexer 318 at the fall edge of the internal clock signal K. This register includes match detection circuits 320, 321, and 322.

The match detection circuit 320 compares the output signal (write address) of the latch circuit 312 with the output of the latch circuit 317 to detect whether they match or not. If the match has been detected, the match detection circuit activates and outputs the first match detection signal HIT1 at a LOW level. If a mismatch has been detected, the match detection circuit 320 outputs the first match detection signal HIT1 at a HIGH level.

The match detection circuit 321 compares the output signal of the latch circuit 314 with the output of the latch circuit 317 to detect whether they match or not. If the match has been detected, the match detection circuit 321 activates and outputs the second match detection signal HIT2 at a LOW level. If a mismatch has been detected, the match detection circuit 321 outputs the second match detection signal HIT2 at a HIGH level.

The match detection circuit 322 compares the output signal (write address) of the latch circuit 314 with the refresh address AddF to detect whether they match or not and outputs a match detection signal HITW indicating the match between the refresh address and the write address. If the match has been detected, the match detection circuit 322 activates a match detection signal HITW at a LOW level. If a mismatch has been detected, the match detection circuit 322 outputs the match detection signal HITW at a HIGH level.

A set of latch circuits 312 to 315, of which the latch circuits 312 and 314 sample data at the fall edge of the write control clock signal KW and the latch circuits 313 and 315 sample data at the rise edge of the write control clock signal KW, function as the write address holding circuit which delays a write address by two write cycles according to the specifications for the late write. The latch circuit 315 in the final stage which constitutes the write address holding circuit performs outputting at the rise of the write control clock signal KW, at a timing delayed by two write cycles after sampling at the latch circuit 311 has been performed. The latch circuit 316 outputs a write signal ADWF (corresponding to the ADWF in FIG. 1) at the fall of the internal clock signal K.

The latch circuit 319 receives the output signal of the multiplexer 318 and samples the received signal at the fall edge of the internal clock signal K to output the sampled signal.

If the write address which has been entered two write cycles earlier matches the refresh address, the signal HITW to the refresh control circuit 133 in FIG. 1 is set to a LOW level and a refresh operation is caused to stop. In other words, the refresh control circuit 133 that receives the signal HITW, deactivates the refresh control signal RFC, thereby to stop the refresh operation.

In the register shown in FIG. 4, which has a configuration different from the configuration of the register shown in FIG. 2, a refresh is executed only at the port for a read system of the cell array. For this reason, determination whether a refresh address matches an external address is performed only for a write address. In the register shown in FIG. 4, determination whether the refresh address matches the write address is made in a cycle before a writing operation on the cell array is performed.

The register for holding a column address (indicated by reference numeral 136 in FIG. 1) has the same configuration as in FIG. 2.

Figure 5:
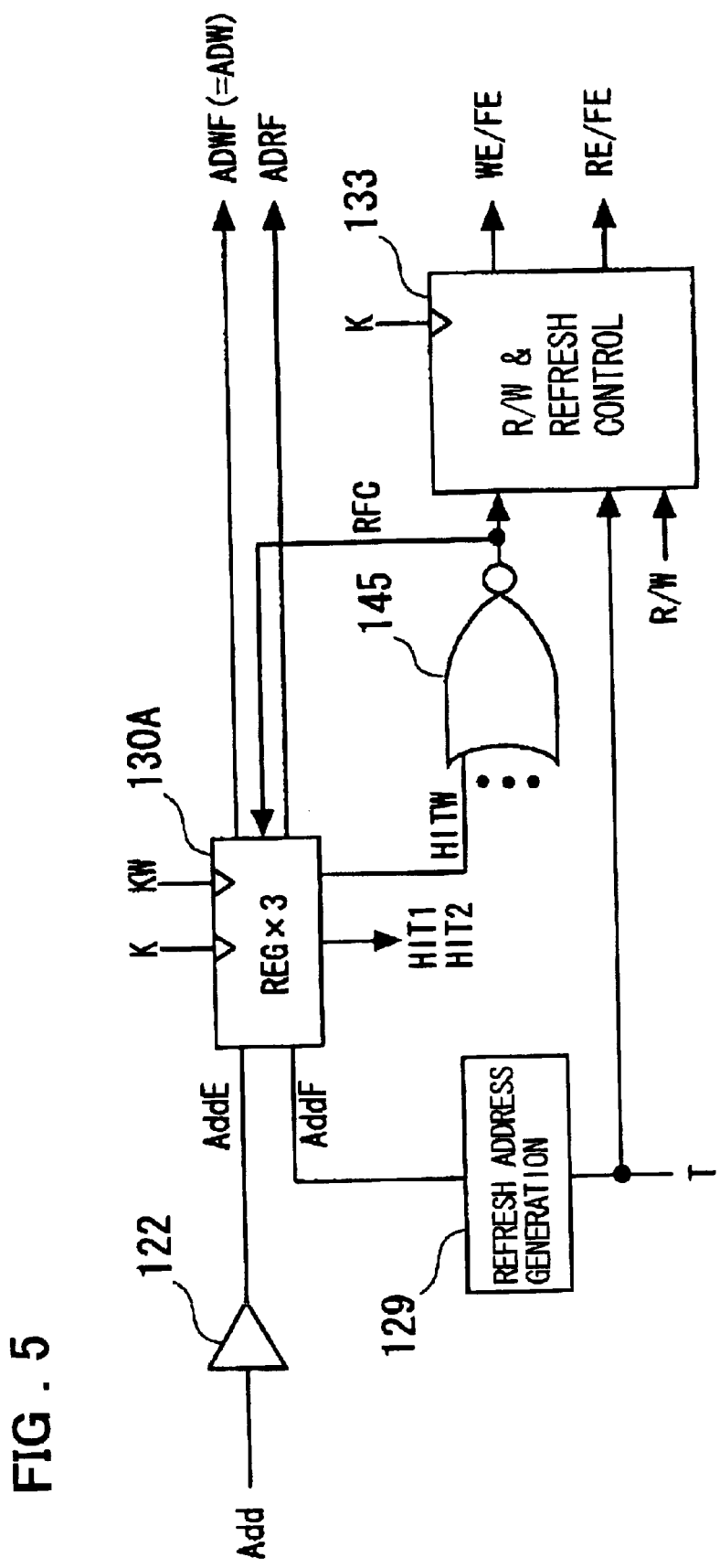
FIG. 5 is a diagram showing an example of connection between the register and an read/write and refresh control circuit according to the second embodiment of the present invention.

FIG. 5 is a diagram showing an example of the configuration of the refresh control circuit when a register 130A in the embodiment shown in FIG. 4 has been employed. Referring to FIG. 5, this refresh control circuit includes a logic gate 145 which receives the HITW signals, the number of which corresponds to the number of the row address signals (from A0 to Am), from the register 130A shown in FIG. 4 and output the result of an NOR operation on the received signals as the refresh control signal RFC. The read/write and refresh control circuit 133 receives the output of the logic gate 145, the internal clock signal K, the refresh trigger signal T, and the R/W signal and outputs the signals WE/FE and RE/FE for controlling refreshing operations for a write system and the read system, respectively.

The logic gate 145 receives the signals HITW, the number of which corresponds to the number of the row address signals (from A0 to Am) and when the HITWs are all at the LOW level (indicating matches), the logic gate 145 outputs the refresh control signal RFC at the HIGH level.

In FIG. 4, for a description purpose, the match detection circuit (indicated by reference numeral 322 in FIG. 4) for detecting that the refresh address matches the write address input at a time corresponding to two write cycles earlier is assumed to be an exclusive OR inputting two bits, and to include m match detection circuits for the row address signals (A0 to Am) for outputting m HITE signals. On the other hand, if the match detection circuit 322 in FIG. 4 is configured to compare the write address of m bits output from the latch circuit 314 in parallel with the refresh address of m bits output in parallel from the register 311 to detect whether they match, to output an one-bit signal HITE, the logic gate 145 in FIG. 5 is replaced by an inverter that receives the one-bit signal HITW.

In the configuration shown in FIG. 5, determination as to a write address output from the latch circuit 314 which was described with reference to FIG. 4 and a refresh address is made one cycle earlier and is indicated by the HITW signal input to the logic gate 145, thereby to make a delay of the signal HITW on a signal path (a comparison time between the external address and the refresh address) being hidden. In other words, the time of the signal from the rise of the internal clock signal K to the rise of the refresh control signal RFC is shortened.

Figure 6:
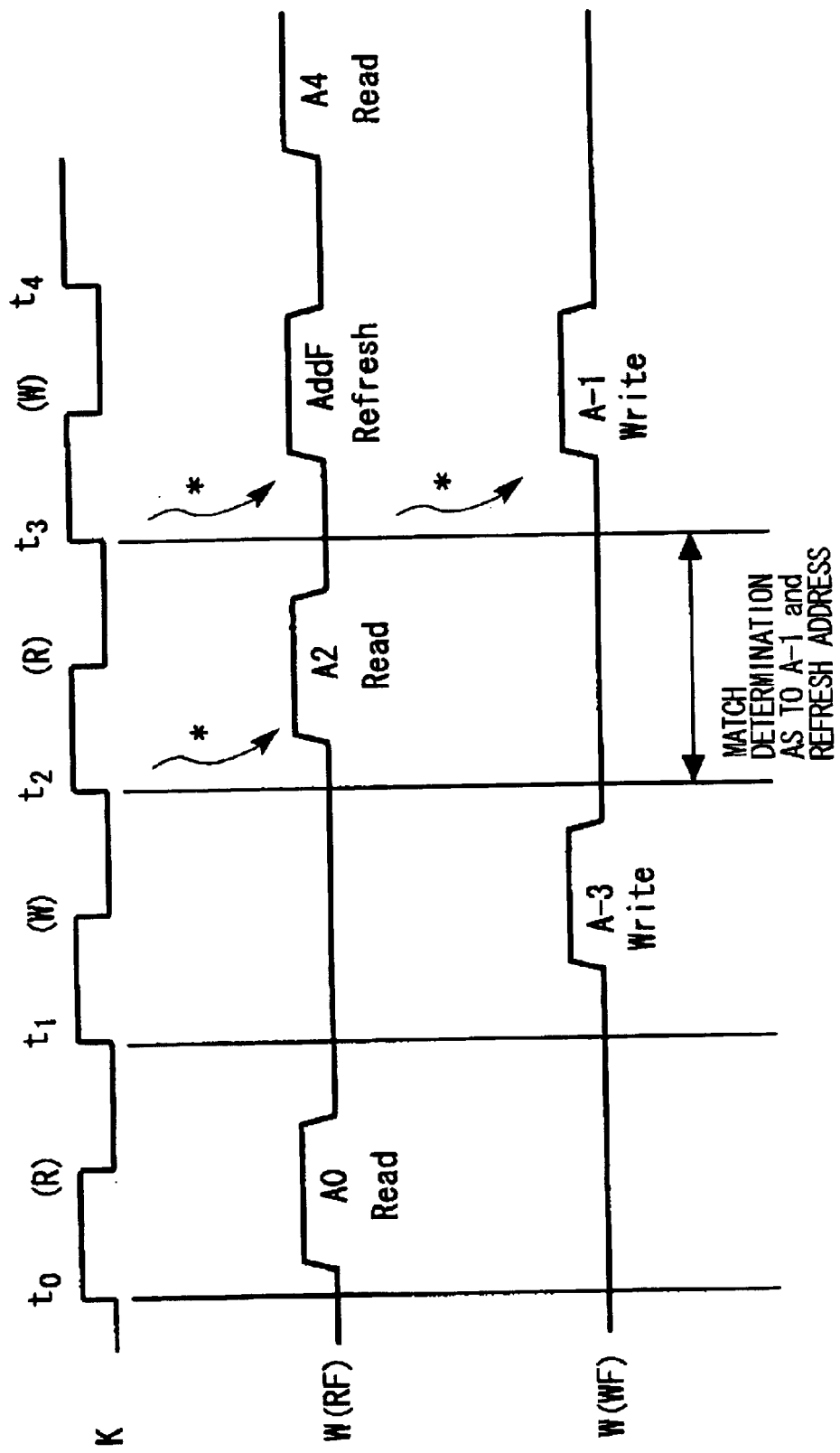
FIG. 6 is a timing diagram for explaining an example of the operation according to the second embodiment of the present invention.

FIG. 6 is a timing diagram for explaining an operation of the read/write and refresh control circuit 133 shown in FIG. 5.

As described before, in this embodiment, a refresh is executed only at the port for a read system. For this reason, only determination whether a refresh address matches a write address (row address) or not is made. In the register 130A, match detection of the addresses is performed in a cycle before a write access is started. That is, in the cycle between timings t2 and t3 in FIG. 6, determination whether an address A−1 in a write cycle starting at the timing t3 matches the refresh address is made. If a mismatch has been detected, the multiplexer 318 selectively outputs the refresh address AddF according to the refresh control signal RFC and outputs the refresh address AddF as an ADRF. In a clock cycle starting at the timing t3, the word line W(RF) for a read system is selected according to the refresh address AddF, and hence a refresh operation is performed and a write operation to a cell associated with the address A−1 is performed. In this embodiment, the refresh address is compared with the write address before the start of a write cycle. Thus, compared with a configuration where one of a read address and a write address delayed by two write cycles is selected to be compared with a refresh address, the operation can be made faster.

Figure 7:
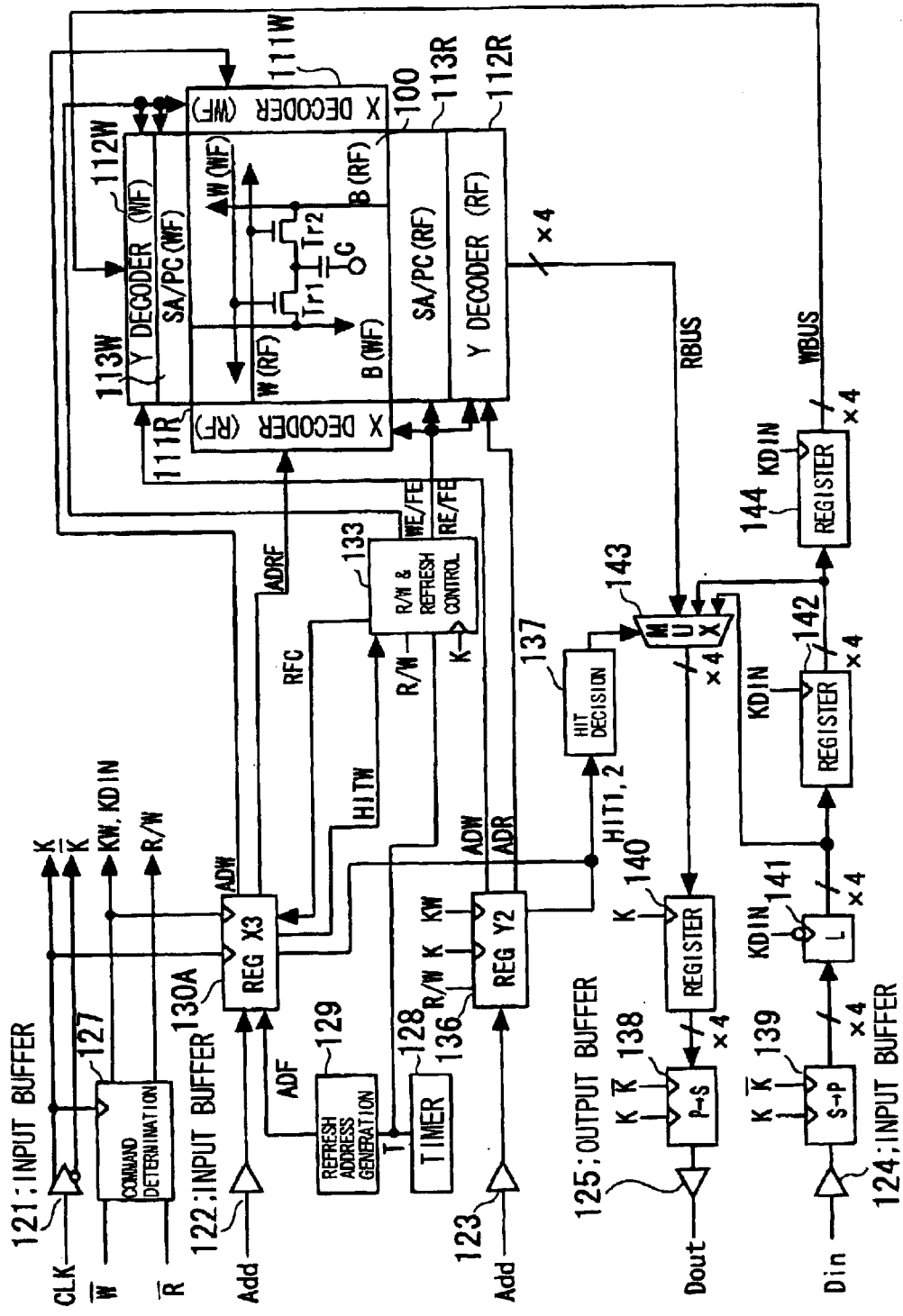
FIG. 7 is a diagram showing the cell array and the overall configuration of a semiconductor memory device according to the second embodiment of the present invention.

FIG. 7 is a diagram showing an overall configuration using the register 130A shown in FIG. 4. In this embodiment, a refresh is executed only at the port for a read system, and determination at the register 130A whether a refresh address matches an external address is performed by executing only determination as to a write address. In this embodiment, at the register 130A, determination whether the refresh address matches the write address is performed in a cycle before a write operation on the cell array 100 is performed.

Referring to FIG. 7, in the present embodiment, there are provided the read/write and refresh control circuit 133, the X decoder 111W, the X decoder 111R, the Y decoder 112W, the Y decoder 112R, the sense amplifier 113W, and the sense amplifier 113R. The read/write and refresh control circuit 133 outputs the refresh control signal RE/FE for a read system and the control signal WE/FE for controlling an operation in the write system based on the signal HITW indicating the result of comparison from the match detection circuit 322 in the register 130A (refer to FIG. 4) and the control signal R/W indicating a read/write operation.

The X decoder 111W receives and decodes the row address ADW for a write system output from the register 130A to select the first word line for a write system. The X decoder 111R receives and decodes the row address ADRF output from the multiplexer 318 in the register 130A to select the second word line for a read system. The Y decoder 112W receives and decodes a column address for write, output from the register 136. The Y decoder 112R receives and decodes a column address for read, output from the register 136. The sense amplifier 113W, activation of which is controlled by the refresh control signal WE/FE for a write system, is connected to the first bit line for a write system. The sense amplifier 113R, activation of which is controlled by the refresh control signal RE/FE for a read system, is connected to the second bit line for a read system.

In the embodiment shown in FIG. 1, at one of the ports for a write system and the read system, a normal access is performed, while at the other port, the refresh operation is performed, and switching between the normal access and the refresh operation is performed.

On the other hand, in the embodiment shown in FIG. 7, at the Y decoder 111W, sense amplifier 113W, and X decoder 111W for a write system, only write operation is executed and no refresh operation is performed. The refresh operation is performed only at the port for a read system. The configuration other than this is the same as the configuration in FIG. 1.

Figure 8:
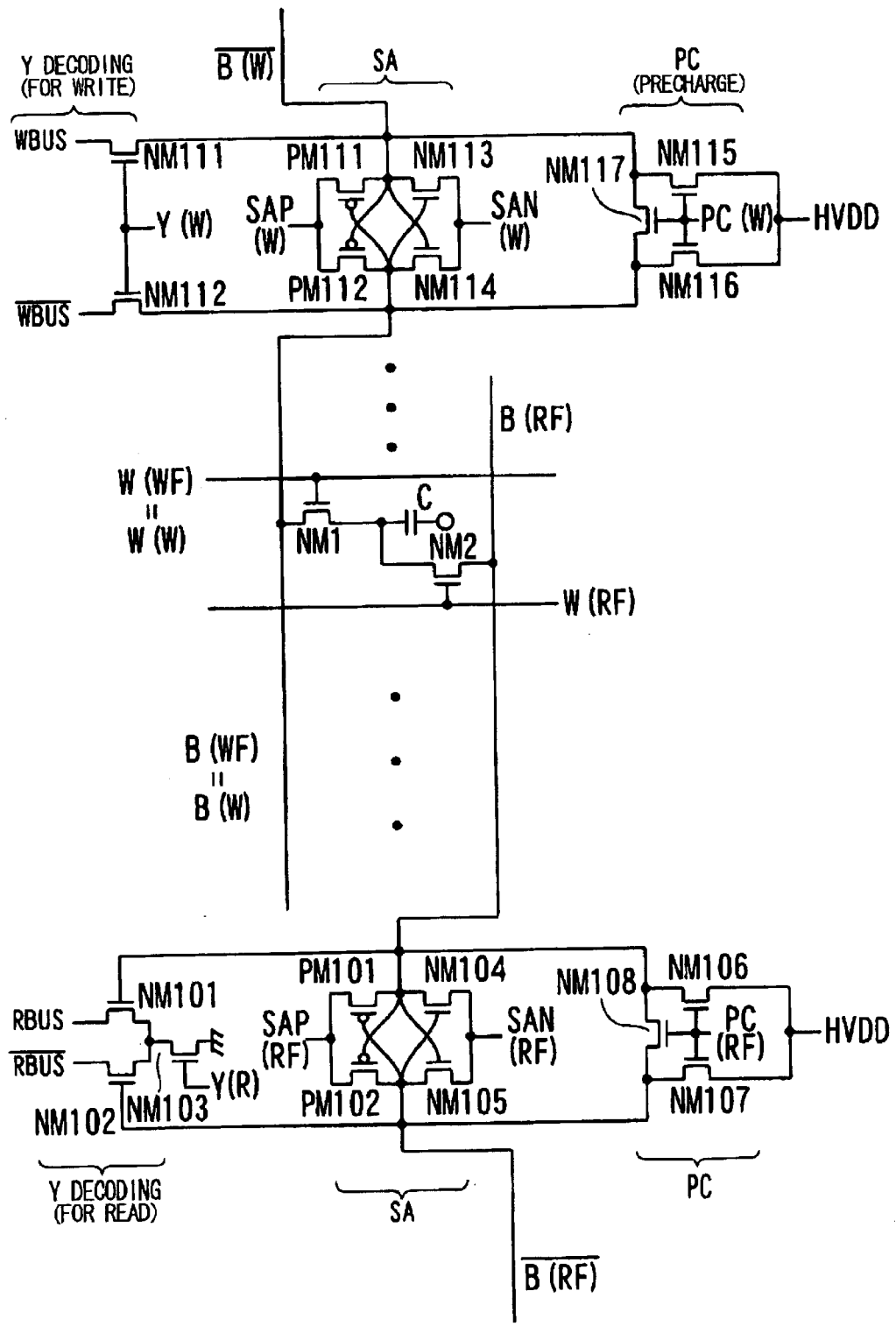
FIG. 8 is a diagram showing a configuration of a core circuit of the cell array according to the second embodiment of the present invention.

FIG. 8 is a diagram showing an example of the configuration of a core of the cell array compliant with QDR specifications. FIG. 8 is associated with the configuration of the cell array 100 in FIG. 7. Referring to FIG. 8, the cell array core includes the read bus RBUS and the Y decoder which constitutes a driver for driving the read bus RBUS (including NMOS transistors NM101 and NM102), and the write bus WBUS and the Y decoder which constitutes a receiver of the write bus WBUS (including NMOS transistors NM111 and NM112), both of which are provided as independent dedicated circuits. The cell array core can avoid concentration and mutual interference of bus interconnections. By optimizing respective circuits for a read system and the write system, a high-speed operation can be achieved.

The Y decoder for reading, for driving the read bus RBUS is composed by a differential pair of the NMOS transistors NM101 and NM102, of which outputs (drains) are connected to the read bus RBUS and its complementary bus/RBUS. The NMOS transistors NM 101 and the NM 102 have gates connected to the bit line B(RF) and its complementary signal /B(RF) respectively, and have sources connected in common to a drain of an NMOS transistor NM103 which constitutes a constant current source and which has a source connected to the ground and a gate connected to a signal Y(R).

The sense amplifier SA for a read system includes NMOS transistors NM104 and NM105 and PMOS transistors PM101 and PM102. The gates and drains of the NMOS transistors NM104 and NM105 are cross-connected, and sources of the NMOS transistors NM104 and NM105 are connected in common to be coupled to a signal SAN(RF). The gates and the drains of the PMOS transistors PM101 and PM102 are cross-connected, and the sources of the PMOS transistors PM101 and PM102 are connected in common to be coupled to a signal SAP(RF). The drains of the PMOS transistor PM101 and the NMOS transistor NM104 are mutually tied to be connected to the bit line B(RF), and the drains of the PMOS transistor PM102 and the NMOS transistor NM105 are mutually tied to be connected to the bit line /B(RF).

The pre-charging circuit (PC) for pre-charging a pair of the bit lines B(RF) and /B(RF) includes NMOS transistors NM106, NM107, and an NMOS transistor NM108. The NMOS transistors NM106 and NM107 are connected to a power supply HDVV (a half VDD), and the pair of the bit lines B(RF) and /B(RF). The NMOS transistor NM108 is connected between the pair of the bit lines B(RF) and /B(RF). The gates of the NMOS transistors NM106, NM107, and NM108 are coupled to a pre-charge control signal PC (RF) for a read system, and are subject to on/off control.

The Y decoder that constitutes the receiver for receiving a signal from the write bus WBUS is connected between the write bus WBUS and its complementary bus /WBUS and between the pair of the bit lines B(WF) and /B(WF). The Y decoder includes the NMOS transistors NM111 and NM112, which have gates connected to a signal Y(W).

The sense amplifier SA for a write system includes NMOS transistors NM113 and NM114 and PMOS transistors PM111 and PM112. The gates and the drains of the NMOS transistors NM113 and NM114 are cross-connected, and the sources of the NMOS transistors NM113 and NM114 are tied in common to be connected to a signal SAN(W). The gates and the drains of the PMOS transistors PM111 and PM112 are cross-connected, and the sources of the PMOS transistors PM111 and PM112 are tied in common to be connected to a signal SAP(W). The drains of the PMOS transistor PM111 and the NMOS transistor NM113 are mutually tied to be connected to the bit line /B(W), and the drains of the PMOS transistor PM112 and the NMOS transistor NM114 are mutually tied to be connected to the bit line B(W).

The pre-charging circuit (PC) for pre-charging the pair of the bit lines B(W) and /B(W) includes NMOS transistors NM115, NM116, and an NMOS transistor NM117. The NMOS transistors NM116 and NM115 are connected to the power supply HDVV (the half VDD), and the pair of the bit lines B(W) and /B(W), respectively. The NMOS transistor NM117 is connected between the pair of the bit lines B(W) and /B(W). The gates of the NMOS transistors NM115, NM116, and NM117 are coupled to the pre-charge control signal PC (RF) for a read system, and are subject to on/off control.

Memory cell transistors NM1 and NM2 constitute one memory cell. One of a drain or the source of the memory cell transistor NM1 is connected to the bit line B(W), the other one of the drain and the source is connected to one end of a capacitor C, and the gate of the memory cell transistor NM1 is connected to a word line W(W). One of the drain or the source of the memory cell transistor NM2 is connected to the bit line B(RF), the other one of the drain and the source is connected to one end of the capacitor C, and the gate of the memory cell transistor NM2 is connected to the word line W(RF).

Figure 9:
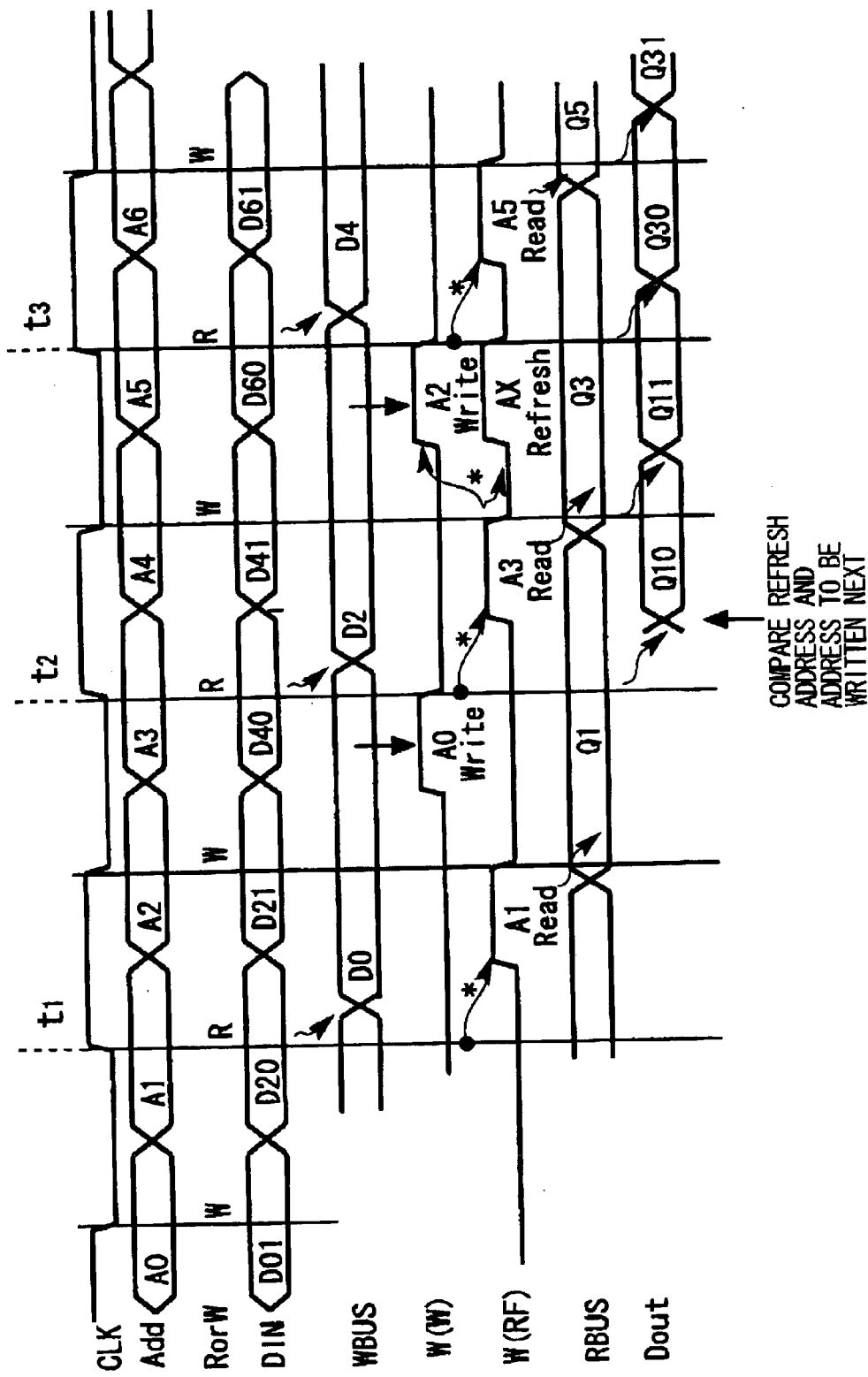
FIG. 9 is a timing diagram for explaining an example of the operation (at QDR with a burst length two) according to the second embodiment of the present invention.

FIG. 9 is a timing diagram for explaining an example of a QDR operation according to the embodiment of the present invention, in which a burst length is two.

Referring to FIG. 9, the CLK denotes the external clock signal CLK in FIG. 1, the Add denotes the address input signal in FIG. 1, RorW denotes a write or a read, the DIN denotes data input to the data input terminal, the WBUS denotes the (parallel data on the) write bus, the W(RF) denotes the word line for a read system, the RBUS denotes the (parallel data on the) read bus, and the Dout denotes the data serially output from the data output terminal.

A read starts at the rise edge of the clock signal CLK. After the read operation, a write operation is performed. A refresh operation is concurrently performed with the write operation, as necessary (e.g. the write operation on an address A2 and the refresh operation on a refresh address AX in a latter half of a clock cycle starting at a timing t2). Operations in an inside are performed at a rate twice as fast as the clock signal CLK.

In a first half cycle of a clock cycle starting at a timing t1, reading of cell data is performed from an address A1, and data Q1 is output onto the RBUS in the latter half of the cycle. In the clock cycle starting at the timing t2, data Q10 and Q11 are serially output from the data output terminal Dout in synchronization with the rise and the fall of the clock. In the first half of the clock cycle starting at the t2, cell data reading from an address A3 is performed. In the first half cycle of the clock cycle starting at the timing t2, a refresh address (Ax) is compared with the address (A2) to be written next. If the A2 is not equal to the Ax, a refresh on the refresh address (Ax) at the port for a read system is performed. If the A2 equals to the Ax, the refresh is stopped. In the latter half cycle of the clock cycle starting at the timing t1, writing of data (D0) at an address A0 associated with the two-bit data D0 on the write bus WBUS is performed. In the latter half cycle of the clock cycle starting at the timing t2 (at the fall of the clock), data writing is performed at the address A2 associated with two-bit data D2 (D20, D21) on the write bus WBUS.

Figure 10:
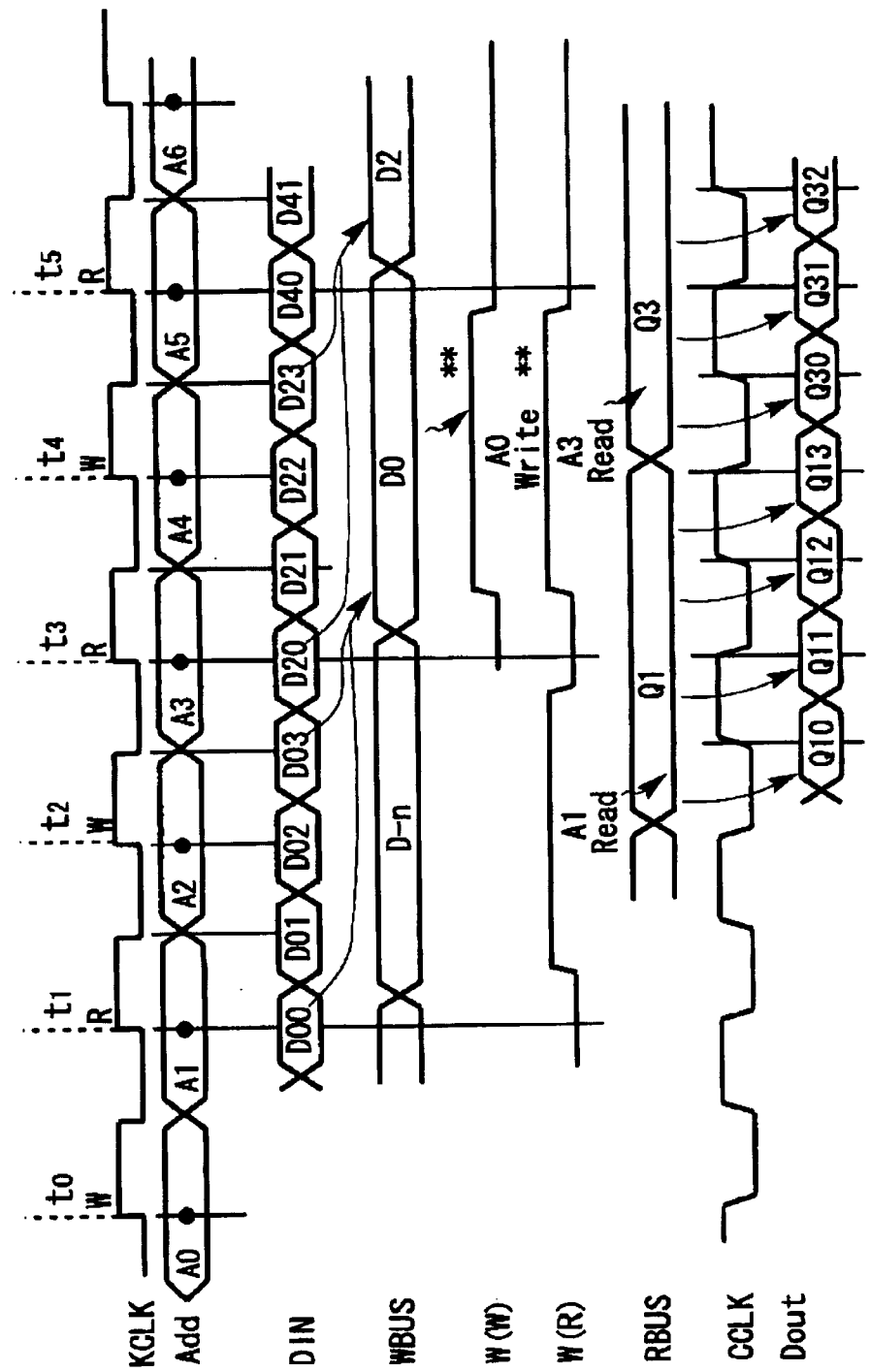
FIG. 10 is a timing diagram showing an example of the operation according to the second embodiment of the present invention, where a read and a write are simultaneously performed during two clock cycles.

FIG. 10 is a timing diagram for explaining the operation of an internal core compliant with the QDR specifications, where a read and a write are simultaneously performed in two clocks. The write and the read are alternately performed in response to each clock of the internal clock signal K. Data signals D00, D01, D02, and D03 are input from the terminal DIN in synchronization with the rise and the fall of the clock cycle starting at the timing t1, and the rise and the fall of the clock cycle starting at the timing t2, respectively, and output in parallel onto the WBUS, corresponding to two clock cycles, in the cycle starting at the timing t3. Data D00, D01, D02, and D03 are written onto four cell arrays at an address A0. Further, during the same two clock cycles, four cell data Q30, Q31, Q32, and Q33 at an address A3 are read onto the RBUS, parallel-to-serial converted, and output serially from the data output terminal DOUT. In this embodiment, the word line W(W) and the word line W(R) are activated for two clock cycles. For this reason, a high-frequency operation can be performed. A clock signal CCLK in FIG. 10 is the internal clock signal that constitutes a trigger for executing parallel-to-serial conversion of parallel data on the read bus RBUS and outputting them to the data output terminal DOUT.

Figure 11:
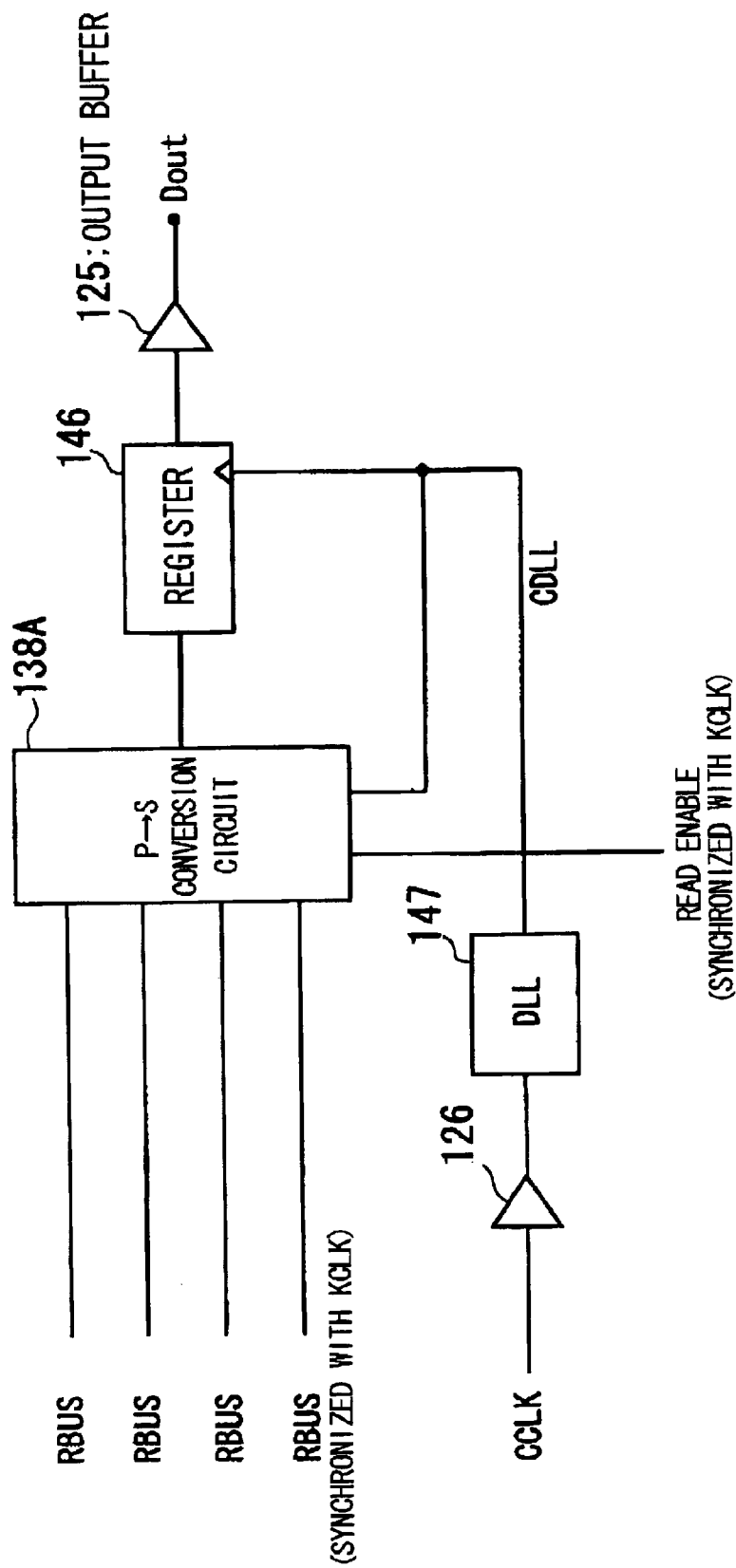
FIG. 11 is a diagram showing a configuration of a reading circuit according to the second embodiment of the present invention.

FIG. 11 is a diagram showing an example of a read circuit for performing the read operation shown in FIG. 10. Referring to FIG. 11, the read circuit includes a parallel-to-serial conversion circuit 138A, a register 146, and an output buffer 125. The parallel-to-serial conversion circuit 138A receives four parallel signals on the internal bus RBUS transferred in synchronization with the internal clock signal KCLK and outputs a serial signal in synchronization with the clock signal. The register 146 latches the output of the parallel-to-serial conversion circuit 138A in response to a clock signal CDDL obtained on delaying the clock signal CCLK through a delay locked loop (Delay Locked Loop: also termed as a "DLL") 147. Any arbitrary known circuit configuration may be employed as the DLL 147. For example, the configuration having first and second delay circuits and a phase detector may be used as a DLL 147. In this configuration, an input signal to the DLL 147 is delayed by the first delay circuit and output. The output of the first delay circuit is supplied to the second delay circuit. The output signal from the second delay circuit and the input signal to the first delay circuit are supplied to the phase detector to detect a phase difference therebetween. According to the detected phase difference, control for adjusting a delay time of the first delay circuit is performed. Alternatively, the DLL 147 may be constituted from a known synchronized-type mirror delay circuit or the like, which includes first and second delay circuits with their directions of clock propagation opposite to each other. The clock signal, which propagates through the first delay circuit in one direction for a predetermined time, is transferred to the second delay circuit at a location corresponding to the propagation point of the clock in the first delay circuit, and then propagates in the second delay circuit in an opposite direction.

Figure 12:
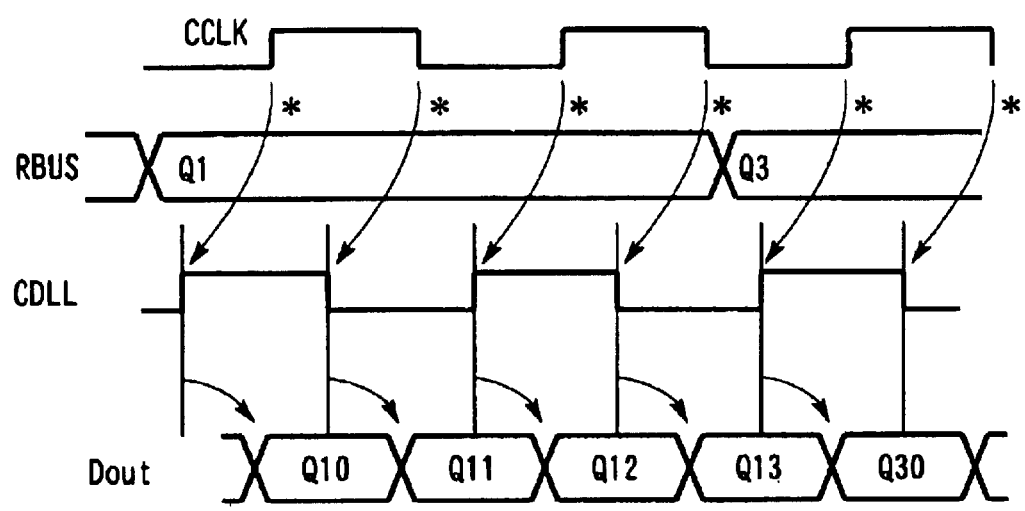
FIG. 12 is a timing diagram for explaining an example of the operation in FIG. 10.
Figure 13:
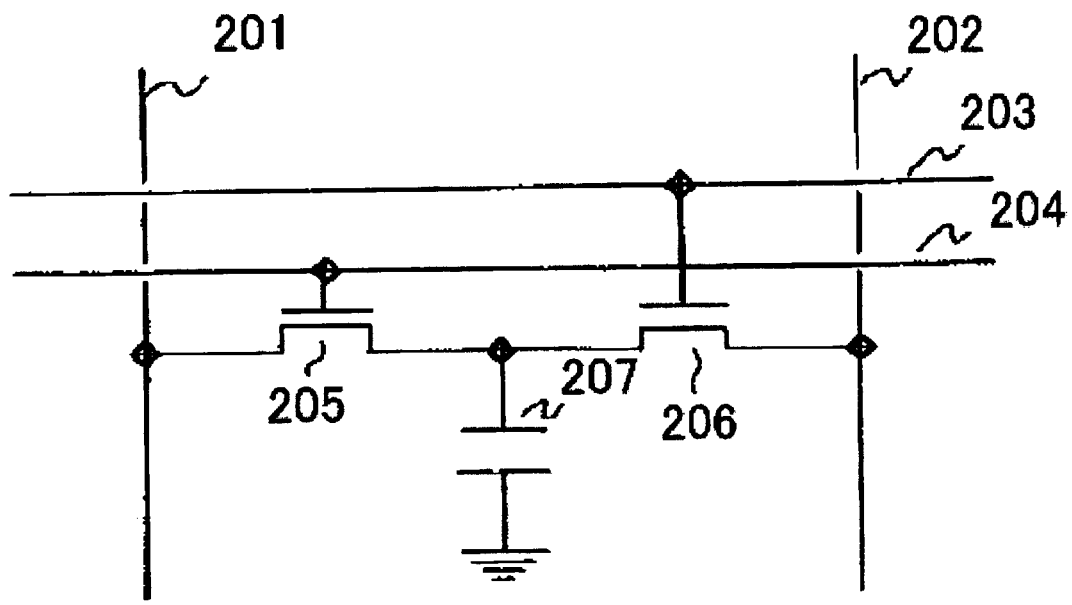
FIG. 13 is a diagram showing a configuration of a conventional DRAM cell.

As shown in FIG. 12, delays of the clock signal CCLK and the Dout are brought forwarded in time by the DLL 147 and sampled by the register 146. For this reason, a data output signal from the data output terminal Dout is output with no delay from the clock signal CCLK. In the configuration using the DLL, a refresh operation requires control from the outside or setting for the WAIT.

As a variation of the embodiments described above, a configuration in which the output of the hit (HIT) determination circuit 137 in FIG. 1 controls the read/write and refresh control circuit 133, and when a match is detected by the hit (HIT) determination circuit 137, reading from the cell array 100 may be disabled.

A foregoing description of the present invention was directed in conjunction with the above-mentioned embodiments. The present invention, however, is not limited to the above-mentioned embodiments, and naturally includes various variations and modifications which could be made by those skilled in the art within the scope of the invention defined in the claims.

The meritorious effects of the present invention are summarized as follows.

As described above, according to the present invention, dual-port DRAM cells with bit lines, word lines, and switch transistors for a write system, and the bit lines, the word lines, and the switch transistors for a read system are included, and a read/write operation and a refresh operation are performed concurrently if a refresh address does not match a read/write address. A need for provision of a deselect time for the refresh operation is thereby eliminated and hence a clock-synchronous-type high-speed SRAM can be implemented at a low cost, with a smaller chip area and lower power dissipation.

According to the present invention, a port for performing a refresh operation is fixed in advance at one of two ports for a read system and the write system. Then, when a refresh address is compared with the row address of a write address and they do not match, for example, a write operation and the refresh operation are performed concurrently using the port for a write system and the port for a read system. A circuit configuration can be thereby more simplified and can accommodate to a high-speed operation, compared with the configuration in which the port for performing a refresh operation can be switched between the two ports for a read system and the write system.

Further, according to the present invention, before a write operation is started on the cell array, a refresh address is compared with a write address to detect whether the refresh address matches the write address or not. A delay on a signal path from a latch timing of the refresh address to output timing of the refresh control signal is apparently reduced, thereby to enable the high-speed operation.

Still further, according to the present invention, a word line is selected using a plurality of internal clock cycles. A sufficient timing margin can be thereby ensured even if the high-speed operation is performed.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:

a cell array having a plurality of memory cells, each of said memory cells including:
   first and second switch transistors connected in series between a first bit line for a write system and a second bit line for a read system; and
   a capacitor for storing data, connected to a connection node at which the first and second switch transistors are tied;
   the first and second switch transistors having control terminals connected to a first word line for a write system and a second word line for a read system respectively;

an address holding circuit for receiving and holding an address signal supplied from an outside of said semiconductor memory device;

a first determination circuit for comparing a refresh address with a row address, selected according to a control signal commanding a read/write operation, between row addresses of a read address signal and a write address signal held in said address holding circuit to determine whether the refresh address matches the selected row address or not; and a control unit for performing control so that when a mismatch is detected as a result of the determination by said first determination circuit, the read or write operation and a refresh operation are performed in parallel, wherein the read or write operation is performed using the word line and the bit line for one of said read and write systems for the memory cell selected by the read or write address signal, while the refresh operation is performed using the word line and the bit line for the other of said read and write systems for the memory cell selected by the refresh address signal and a sense amplifier for the other of said read and write systems, and when the match is detected as the result of the determination by said first determination circuit, the refresh operation is inhibited and the read or write operation using the word line and the bit line for said one of said read and write systems for the memory cell selected by the read or write address signal is performed.

2. The semiconductor memory device according to claim 1, further comprising:

a second determination circuit for determining whether the address signal supplied to said semiconductor memory device from the outside of said semiconductor memory device matches the write address signal held in said address holding circuit;

a data holding circuit for holding data for write; and a control circuit for performing control so that when a input read address signal matches the write address signal held in said address holding circuit as a result of the determination by said second determination circuit, data held in the data holding circuit is output from a readout data output terminal.

3. The semiconductor memory device according to claim 1, wherein said first determination circuit compares the refresh address with the row address of the write address signal to determine whether the refresh address matches the row address of the write address signal before a cycle of performing the write operation to said cell array is started.

4. The semiconductor memory device according to claim 1, wherein said address holding circuit comprises:

a first address holding circuit for holding the row address of the write address signal (referred to as a "row address for a write system") input from an address terminal, delaying the row address for a write system by a predetermined number of write cycles to output the delayed row address, and outputting the row address for the read address signal (referred to as a "row address for a read system") input from said address terminal without delay; and a second address holding circuit for holing a column address of the write address signal (referred to as a "column address for a write system") input from said address terminal, delaying the column address for a write system by the predetermined number of write cycles to output the delayed the column address, and outputting a column address of the read address signal (referred to as a "column address for a read system") input from said address terminal without delay;

wherein said first address holding circuit comprises at least one match detection circuit for determining whether the row address for the address signal input from said address terminal matches the row address of the write address signal held in said first address holding circuit; and wherein said second address holding circuit comprises at least one match detection circuit for determining whether the column address of the address signal input from said address terminal matches the column address of the write address signal held in said second address holding circuit.

5. The semiconductor memory device according to claim 4, further comprising:

a first selection circuit for receiving the row addresses for said write and read systems output from said first address holding circuit, selecting and outputting the row address for read supply when the control signal commanding the read/write operation indicates a read, and selecting and outputting the row address for write when the control signal indicates a write;

an address comparison circuit for comparing the row address output from said first selection circuit with the refresh address output from a refresh address generation circuit;

a read/write and refresh control circuit for outputting a refresh control signal for a read system and a refresh control signal for a write system for controlling a refresh using one of the addresses for said read and write systems according to a result of the comparison from said address comparison circuit and the control signal commanding the read/write operation;

a second selection circuit for receiving the row address for write output from said first address holding circuit and the refresh address output from said refresh address generation circuit, receiving the refresh control signal for a write system from said read/write and refresh control circuit as a selection control signal, selecting and outputting the refresh address when the refresh control signal for a write system is activated to indicate the refresh, and selecting and outputting the row address for write when the refresh control signal for a write system is deactivated;

a third selection circuit for receiving the row address for read output from said first address holding circuit and the refresh address from said refresh address generation circuit, receiving the refresh control signal for a read system from said read/write and refresh control circuit as the selection control signal, selecting and outputting the refresh address when the refresh control signal for a read system is activated to indicate the refresh, and selecting and outputting the row address for read for supply when the refresh control signal for a read system is deactivated;

a first X decoder receiving and decoding the row address from said second selection circuit for selecting the first word line for a write system;

a second X decoder receiving and decoding the row address from said third selection circuit for selecting the second word line for a read system;

a first Y decoder receiving and decoding the column address for write output from said second address holding circuit, activation of said first Y decoder being controlled by the refresh control signal for a write system from said read/write and refresh control circuit;

a first sense amplifier connected to the first bit line for a write system, activation of said first sense amplifier being controlled by the refresh control signal for a write system from said read/write and refresh control circuit;

a second Y decoder for receiving the column address for read output from said second address holding circuit, activation of said second Y decoder being controlled by the refresh control signal for a read system from said read/write and refresh control circuit; and a second sense amplifier connected to the second bit line for a read system, activation of said second sense amplifier being controlled by the refresh control signal for a read system from said read/write and refresh control circuit.

6. The semiconductor memory device according to claim 5, wherein said first and second X decoders are disposed to be opposite to each other with respect to said cell array interposed therebetween; and wherein said first and second sense amplifiers are disposed to be opposite to each other with respect to said cell array interposed therebetween.

7. The semiconductor memory device according to claim 4, wherein said first and second write address holding circuits respectively comprises an address holding circuit constituted from pairs of latch circuits connected in cascade, each of said pairs of latch circuits sampling data at falling and rise edges of a clock signal for write control, a number of said pairs being equivalent to the predetermined number of write cycles.

8. The semiconductor memory device according to claim 5, wherein the semiconductor memory device is interface compatible with a clock synchronous type static random access memory.

9. The semiconductor memory device according to claim 1, wherein said semiconductor memory device comprises:

a timer generating a trigger signal for defining a refresh cycle; and a refresh address generation circuit for generating the refresh address based on the trigger signal from said timer, wherein said semiconductor memory device is interface compatible with a static random access memory of a clock synchronous type.

10. The semiconductor memory device according to claim 1, further comprising:

a control circuit for performing control so that over a plurality of clock cycles, the selected word line is activated, and data writing to the memory cell or data reading from the memory cell is performed.

11. The semiconductor memory device according to claim 10, wherein two data items are input/output from a data input terminal/data output terminal in one clock cycle at rise and fall edges of a clock;

the semiconductor memory device comprises:

a parallel-to-serial conversion circuit for converting four data items read in parallel to four serial data items in two clock cycles; and a delay control circuit for controlling a delay in a timing of the clock supplied to said parallel-to-serial conversion circuit; and a timing of output from said data output terminal is in synchronization with the clock signal.

12. The semiconductor memory device according to claim 1, further comprising:

a control circuit for performing control so that when the mismatch is detected as the result of the determination by said first determination circuit, the read or write operation and the refresh operation are simultaneously started.

13. A semiconductor memory device comprising a cell array having a plurality of memory cells, each of said memory cells including:

first and second switch transistors connected in series between a first bit line for a write system and a second bit line for a read system; and a capacitor for storing data, connected to a connection node at which the first and second switch transistors are tied;

the first and second switch transistors having control terminals connected to a first word line for a write system and a second word line for a read system respectively;

an address holding circuit for receiving and holding a row address of an address signal for write supplied from an outside of said semiconductor memory device;

a first determination circuit for comparing a refresh address with the row address of the address signal for write held in said address holding circuit to determine whether the refresh address matches the row address for the address signal for write or not; and a control unit for performing control so that when a mismatch is detected as a result of the determination by said first determination circuit, a write operation and a refresh operation are performed in parallel, wherein the write operation is performed using the word line and the bit line for a write system for the memory cell selected by the address signal for write, while the refresh operation is performed using the word line and the bit line for a read system for the memory cell selected by the refresh address and a sense amplifier for a read system, and when the match is detected as the result of the determination by said first determination circuit, the refresh operation is inhibited, and the write operation is performed.

14. The semiconductor memory device according to claim 13, further comprising:

a second determination circuit for determining whether the address signal supplied to said semiconductor memory device from the outside of said semiconductor memory device matches the write address signal held in said address holding circuit;

a data holding circuit for holding data for write; and a control circuit for performing control so that when a read address signal matches the write address signal held in said address holding circuit as a result of the determination by said second determination circuit, data held in the data holding circuit is output from a readout data output terminal.

15. The semiconductor memory device according to claim 13, wherein said first determination circuit compares the refresh address with the row address of the write address signal to determine whether the refresh address matches the row address of the write address signal before a cycle of performing the write operation to said cell array is started.

16. The semiconductor memory device according to claim 13, wherein said address holding circuit comprises:

a first address holding circuit for holding the row address of the write address signal (referred to as a "row address for write") input from an address terminal, delaying the row address for write by a predetermined number of write cycles to output the delayed row address, and outputting a row address of a read address signal (referred to as a "row address for read") input from said address terminal without delay; and a second address holding circuit for holding a column address of the write address signal (referred to as a "column address for write") input from said address terminal, delaying the column address for write by the predetermined number of write cycles to output the delayed row address, and outputting a column address of the read address signal (referred to as a "column address for read") input from said address terminal without delay;

wherein said first address holding circuit comprises:

a first match detection circuit for comparing the row address for write with the refresh address to determine whether the row address for write matches the refresh address before delaying the row address for write by the predetermined number of write cycles for supply; and at least one second match detection circuit for determining whether the row address for the address input from said address terminal matches the row address of the write address held in said first address holding circuit; and wherein said second address holding circuit comprises:

at least one match detection circuit for determining whether the column address for the address input from said address terminal matches the column address for the write address held in said second address holding circuit; and said first match detection circuit in said first address holding circuit constitutes said first determination circuit.

17. The semiconductor memory device according to claim 16, wherein said first address holding circuit comprises:

a latch circuit of an input stage, for sampling row address signal of an address signal input from said address terminal in response to an internal clock signal; and a write address holding circuit comprising a plurality of latch circuits connected in cascade, each of said latch circuits sampling a signal at an input terminal thereof to output the sampled signal from an output terminal thereof in response to a clock signal for write control activated during a write cycle, a first stage of said latch circuits receiving an output signal of said latch circuit of said input stage at the input terminal thereof, and the output signal of said latch circuit of said input stage being delayed by the predetermined number of write cycles and output from the output terminal of a last stage of said latch circuits;

wherein said first match detection circuit compares an output signal of a stage of said latch circuits preceding said last stage in said write address holding circuit with the refresh address to determine whether the output signal matches the refresh address or not;

wherein said second match detection circuit compares the output signal of said stage of said latch circuits preceding said last stage in said write address holding circuit with the output signal of said latch circuit in said input stage to determine whether the output signals match with each other or not; and wherein said semiconductor memory device further comprises:

a selection circuit for receiving an output of said latch circuit in said input stage and the refresh address, selecting the refresh address when a refresh control signal as a selection control signal is activated, and selecting the output of said latch circuit in said input stage when the refresh control signal is deactivated.

18. The semiconductor memory device according to claim 17, further comprising:

a control circuit for performing control so that when there is even one unmatching bit between the row address for write held in said first address holding circuit and the refresh address, the refresh control signal is activated, and a read or write operation and the refresh operation are performed in parallel, the read or write operation being performed using the word line and the bit line for one of said read and write systems, selected by the address for said read or write system, the refresh operation being performed using the word line and the bit line for the other of said read and write systems selected by the refresh address and a sense amplifier for the other of said read and write systems.

19. The semiconductor memory device according to claim 16, further comprising:

a read/write and refresh control circuit for outputting a refresh control signal for a read system and a control signal controlling an operation of said write system according to a result of the comparison from said match detection circuit of said first address holding circuit constituting said first determination circuit and a control signal commanding a read operation or the write operation;

a first X decoder receiving and decoding the row address for write output from said first address holding circuit for selecting the first word line for a write system;

a second X decoder receiving and decoding the row address output from a selection circuit of said first address holding circuit for selecting the second word line for a read system;

a first Y decoder receiving and decoding the column address for write output from said second address holding circuit;

a second Y decoder receiving and decoding the column address for read output from said second address holding circuit;

a first sense amplifier connected to the first bit line for a write system; and a second sense amplifier connected to the second bit line for a read system, activation of said second sense amplifier being controlled by the refresh control signal for a read system from said read/write and refresh control circuit.

20. The semiconductor memory device according to claim 19, wherein said first and second X decoders are disposed to be opposite to each other with respect to said cell array interposed therebetween; and wherein said first and second sense amplifiers are disposed to be opposite to each other with respect to said cell array interposed therebetween.

21. The semiconductor memory device according to claim 16, wherein said first and second write address holding circuits respectively comprises an address holding circuit constituted from pairs of latch circuits connected in cascade, each of said pairs of latch circuits sampling data at falling and rise edges of a clock signal for write control, a number of said pairs being equivalent to the predetermined number of write cycles.

22. The semiconductor memory device according to claim 19, wherein the semiconductor memory device is interface compatible with a clock synchronous type static random access memory.

23. The semiconductor memory device according to claim 13, wherein said semiconductor memory device comprises:

a timer generating a trigger signal for defining a refresh cycle; and a refresh address generation circuit for generating the refresh address based on the trigger signal from said timer, wherein said semiconductor memory device is interface compatible with a static random access memory of a clock synchronous type.

24. The semiconductor memory device according to claim 13, further comprising:

a control circuit for performing control so that over a plurality of clock cycles, the selected word line is activated, and data writing to the memory cell or data reading from the memory cell is performed.

25. The semiconductor memory device according to claim 24, wherein two data items are input/output from a data input terminal/data output terminal in one clock cycle at rise and fall edges of a clock;

the semiconductor memory device comprises:

a parallel-to-serial conversion circuit for converting four data items read in parallel to four serial data items in two clock cycles; and a delay control circuit for controlling a delay in a timing of the clock supplied to said parallel-to-serial conversion circuit; and a timing of output from said data output terminal is in synchronization with the clock signal.

26. The semiconductor memory device according to claim 13, further comprising:

a control circuit for performing control so that when the mismatch is detected as the result of the determination by said first determination circuit, the write operation and the refresh operation are simultaneously started.

27. A semiconductor memory device comprising:

a data input buffer having at least an input terminal for receiving a plurality of data signals serially supplied to the semiconductor memory device from an outside of the semiconductor memory device, said plurality of data signals including at least two consecutive data signals, one of which corresponds to a rising edge of a clock signal for use of synchronized operation and other of which corresponds to a falling edge of the clock signal;

a first converter, receiving a plurality of data signals serially output from the data input buffer, for applying serial to parallel conversion to the serially received data signals to derive and output parallel data signals;

a first register, receiving the parallel data signals output in parallel from the first converter, for sampling the parallel data signals;

an address register, receiving an input address signal supplied to the semiconductor memory device from the outside of the semiconductor memory device, for sampling and holding the input address signal by using a rising edge and/or a falling edge of the clock signal;

a first control circuit for generating a read/write control signal commanding a read/write operation;

a memory cell array having a plurality of memory cells, said memory cell array being so adapted to receive and store the parallel data signals output from said first register in the memory cells associated with the input address signal output from said address register via a write bus when the read/write control signal indicate a write operation and to output data, which are read from the memory cells associated with the input address signal received from said address register, as parallel data signals to a read bus when the read/write control signal indicate a read operation, each of said memory cells being a dual port memory cell which needs a refresh operation in order to hold data stored therein;

a multiplexer, receiving from the read bus the parallel data signals read from said memory cell array and said parallel data signals output from said first register, as two inputs, for selecting and outputting one of two inputs;

a second converter, receiving the parallel data signals output from said multiplexer, for applying parallel to serial conversion to the received parallel data signals to output a resultant plurality of data signals serially;

a data output buffer having at least an input terminal for receiving the plurality of data signals serially output from said second converter and an output terminal for outputting the received data signals serially to the outside of the semiconductor memory device;

a refresh address generator for generating a refresh address signal;

an address comparator, receiving the refresh address signal output from the refresh address generator with the input address signal held in the address register for comparing the refresh address signal with the input address signal to output a comparison result indicating whether there is a match between the refresh address signal and the input address signal or not; and a second control circuit for performing control so that refresh operation as to the dual port memory cell associated with the refresh address signal and a read or write operation as to the dual port memory cell associated with the input address signal are executed in parallel, when the comparison result output from the comparator indicates a mismatch between the refresh address signal and the address signal held in the address register.

28. The semiconductor memory device according to claim 27, further comprising a circuit for comparing the input address signal for read and the address signal for write held in the address register; wherein said multiplexer selects and outputs the parallel data signals output from the first register when the input address signal matches for read and the address signal for write held in the address register.

29. A method of controlling a semiconductor memory device including a cell array comprising a plurality of DRAM (dynamic random access memory) cells, each having a port for a write system and a port for a read system, said semiconductor memory device having an auto refresh function and being interface compatible with a static random access memory, said method comprising the steps of:

storing and holding an externally input address in address holding circuit;

comparing a refresh address output from refresh address generation circuit with the address held in said address holding circuit;

performing control so that when the comparison result indicates that the refresh address does not match the address, a read or write operation using one of the ports for the write and read systems of selected one of said DRAM cells and a refresh operation using the other of the ports for the write and read systems are performed in parallel; and performing control so that when the comparison result indicates that the refresh address matches the address, the refresh operation is stopped.

30. A semiconductor memory device adapted to have an interface compatible with that of a static random access memory device, said semiconductor memory device comprising:

a memory cell array including a plurality of cells, each of which has two port for respective write and read operations and needs a refresh operation to hold data stored therein;

an address holding circuit for holding an externally input address signal;

a refresh address generation circuit for generating a refresh address signal; and a comparator circuit for comparing the refresh address signal output from said refresh address generation circuit with the input address signal held in said address holding circuit; and a control circuit for performing control so that, when the comparison result indicates that the refresh address signal does not match the input address signal, a read or write operation using one of the two ports of the cell associated with said input address signal and a refresh operation using the other of the two ports of the cell associated with said refresh address signal are performed in parallel.

* * * * *